(12) United States Patent
Kato et al.

(10) Patent No.: US 12,713,722 B2
(45) Date of Patent: Aug. 18, 2026

(54) SOLID-STATE IMAGING ELEMENT AND METHOD OF MANUFACTURING SAME

(71) Applicant: SONY SEMICONDUCTOR SOLUTIONS CORPORATION, Kanagawa (JP)

(72) Inventors: Akihiko Kato, Kanagawa (JP); Toshihiro Kurobe, Kanagawa (JP); Akiko Honjo, Kanagawa (JP); Koichi Baba, Kanagawa (JP); Naohiko Kimizuka, Kanagawa (JP); Yohei Hirose, Kanagawa (JP); Toyotaka Kataoka, Kanagawa (JP); Takuya Toyofuku, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 462 days.

(21) Appl. No.: 18/257,874

(22) PCT Filed: Nov. 9, 2021

(86) PCT No.: PCT/JP2021/041198
§ 371 (c)(1),
(2) Date: Jun. 15, 2023

(87) PCT Pub. No.: WO2022/137854
PCT Pub. Date: Jun. 30, 2022

(65) Prior Publication Data

US 2024/0096913 A1 Mar. 21, 2024

(30) Foreign Application Priority Data

Dec. 22, 2020 (JP) ................................ 2020-212372

(51) Int. Cl.
*H10F 39/00* (2025.01)
*H04N 25/77* (2023.01)

(52) U.S. Cl.
CPC ....... *H10F 39/8037* (2025.01); *H10F 39/811* (2025.01); *H04N 25/77* (2023.01)

(58) Field of Classification Search
None
See application file for complete search history.

(56) References Cited

U.S. PATENT DOCUMENTS

2004/0262494 A1* 12/2004 Egawa .................. H10F 39/803 257/E27.15
2006/0124976 A1* 6/2006 Adkisson ............ H10D 64/027 257/E21.429

(Continued)

FOREIGN PATENT DOCUMENTS

JP 2004-356246 A 12/2004
JP 2005-019781 A 1/2005

(Continued)

OTHER PUBLICATIONS

International Search Report and Written Opinion of PCT Application No. PCT/JP2021/041198, issued on Jan. 18, 2022, 09 pages of ISRWO.

*Primary Examiner* — Bilkis Jahan
(74) *Attorney, Agent, or Firm* — CHIP LAW GROUP

(57) ABSTRACT

Provided is a solid-state imaging element including pixels, a substrate on which the pixels are provided, a first transistor, in the pixels, that includes a first gate electrode portion, a first gate insulating film provided between an active region of the substrate in which a channel of the first transistor is formed and a first side surface of the first gate electrode portion facing the active region, and a first insulating film on a second side surface of the first gate electrode portion other than the first side surface and thicker than the first gate (Continued)

insulating film, in which a depth of the first insulating film is the same as or deeper than a depth of the first gate electrode portion, and a width of an upper surface of the first gate electrode portion is wider than a width of a bottom surface of the first gate electrode portion.

16 Claims, 27 Drawing Sheets

(56) References Cited

U.S. PATENT DOCUMENTS

| | | | | |
|---|---|---|---|---|
| 2011/0089311 | A1* | 4/2011 | Venezia | H10F 39/802 257/E31.073 |
| 2012/0043589 | A1* | 2/2012 | Nozaki | H10F 39/15 257/225 |
| 2013/0076934 | A1* | 3/2013 | Maeda | H10F 39/802 348/222.1 |
| 2013/0248862 | A1* | 9/2013 | Inoue | H10F 39/804 257/432 |
| 2016/0111459 | A1 | 4/2016 | Matsumoto | |

FOREIGN PATENT DOCUMENTS

| | | | |
|---|---|---|---|
| JP | 2006-121093 | A | 5/2006 |
| JP | 2013-069846 | A | 4/2013 |
| JP | 2013-125862 | A | 6/2013 |
| JP | 2015-053411 | A | 3/2015 |
| JP | 2017-183636 | A | 10/2017 |
| TW | I445166 | B | 7/2014 |
| TW | I534994 | B | 5/2016 |
| WO | 2013/094430 | A1 | 6/2013 |
| WO | 2020/090403 | A1 | 5/2020 |

* cited by examiner

FIG. 1

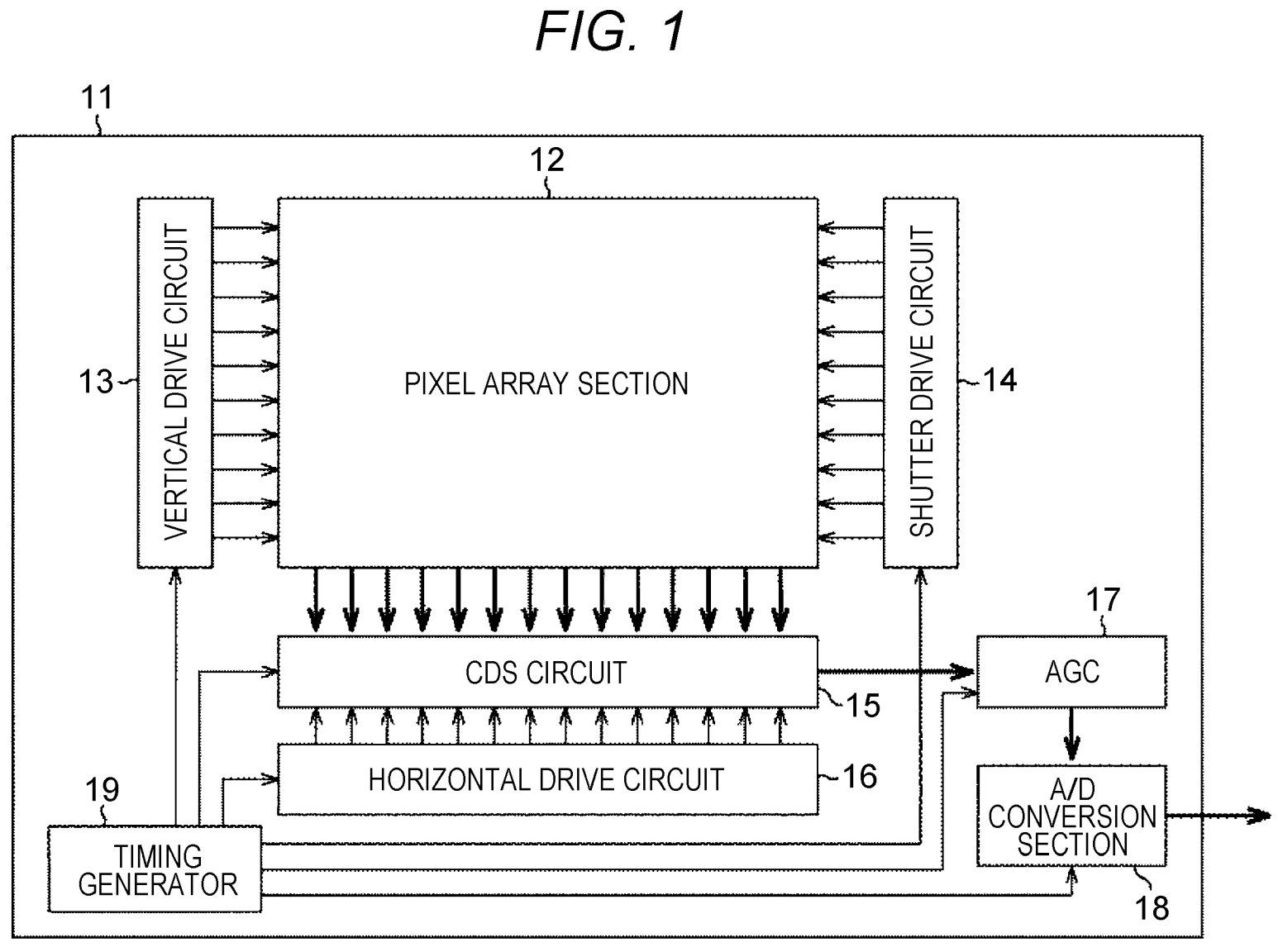

11
12 PIXEL ARRAY SECTION
13 VERTICAL DRIVE CIRCUIT
14 SHUTTER DRIVE CIRCUIT
15 CDS CIRCUIT
16 HORIZONTAL DRIVE CIRCUIT
17 AGC
18 A/D CONVERSION SECTION
19 TIMING GENERATOR 16
15
12
45
44
36
34
35
33
25
21
31
32
46
41
42
43
47
22
23
24
54
53
52
51
26
13

F1
SF1
CH
W34
10
F2
34
20
Wbx
TR
Wtx
G
G1
G2
SF2
30
X
Z
Y

F1
30
SF4
10
F2
TR
Wty
Wby
G
G1
G2
L34
34
30
SF3
Y
Z
X

F1
30_2
F2_2
10
F2
G_2
G2_2 G1_2
TR_2
Wbx
Wtx
20_2
CH_2
20t
SF1_1
SF1_2
W34
CH_1
20_1
Wtx
Wbx
G_1
G1_1 G2_1
TR_1
SF2_1
30_1
34
X
Z
Y

FIG. 7A

F1
30
SF4
D
10
F2
TR
Wty
Wby
G
G1
G2
L34
34
30
SF3
Y
Z
X

F1
30
SF4
D
10
F2
TR
Wty
Wby
L34
G
G1
G2
30
SF3
S
34
Y
Z
X

SF1_2
SF2_2
TR_2
BD
G_2
SF4_2
D
SF4_1
30
SF3_2
20_2
10
S
CH_2
CH_1
20_1
SF3_1
30
B
B
C
C
L34
SF1_1
SF2_1
TR_1
G_1
34
X
Y
Z

F1
30_2
F2_2
10
F2
G_2
G2_2 G1_2
G_3
G2_3 G1_3
20t
Wtx
20t
G_1
G1_1 G2_1
TR_2
20_2
CH_2
BD_2
CH_4
F2_3
F1_2
20_4
TR_3
Wbx
20_3
CH_3
SF1_1
SF1_3
BD_1
CH_1
20_1
TR_1
34
SF2_1
30_1
Z
X
Y

Figure 19:
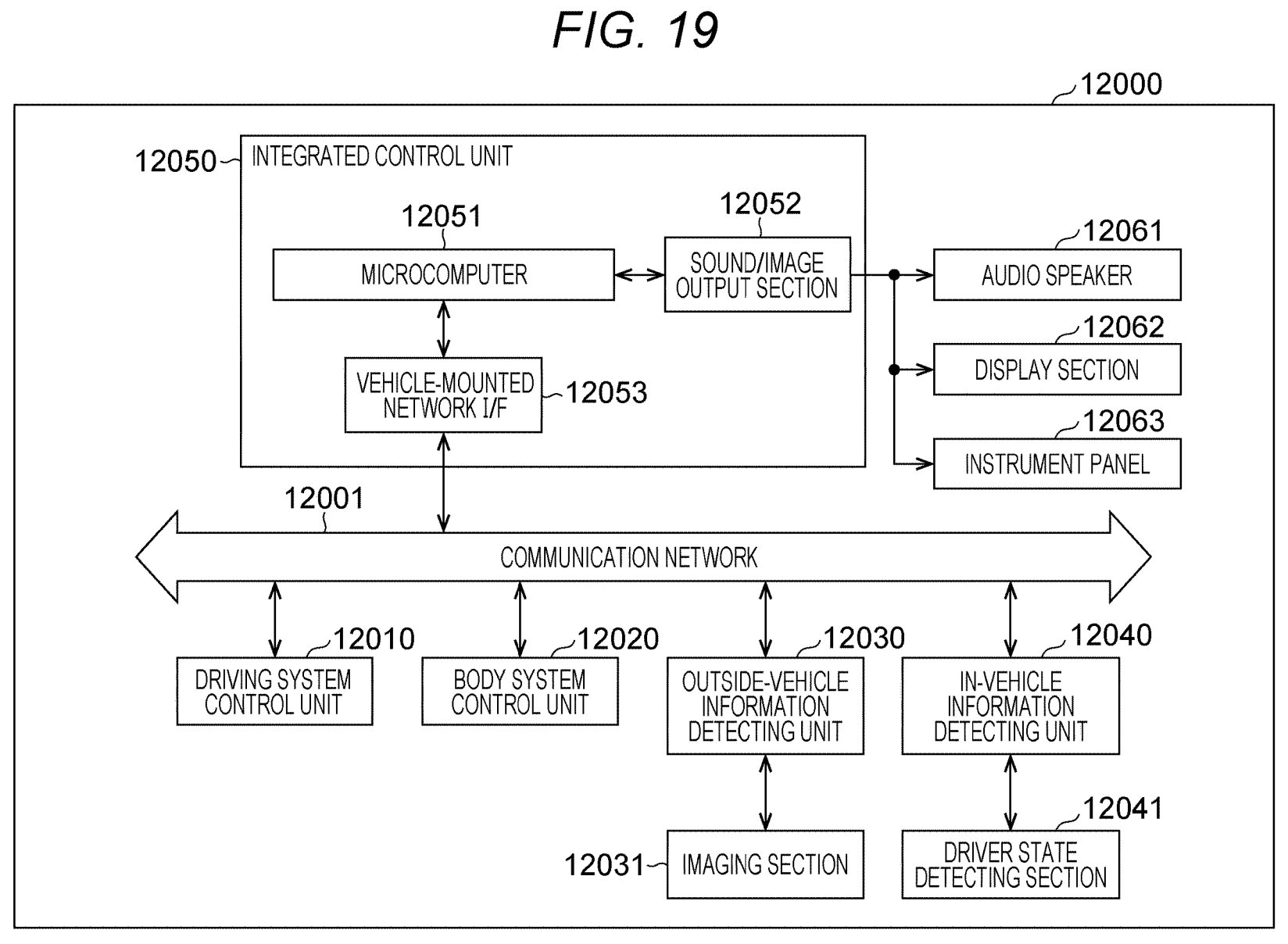

12050 INTEGRATED CONTROL UNIT

12051 MICROCOMPUTER

12052 SOUND/IMAGE OUTPUT SECTION

12053 VEHICLE-MOUNTED NETWORK I/F

12061 AUDIO SPEAKER

12062 DISPLAY SECTION

12063 INSTRUMENT PANEL

12001 COMMUNICATION NETWORK

12010 DRIVING SYSTEM CONTROL UNIT

12020 BODY SYSTEM CONTROL UNIT

12030 OUTSIDE-VEHICLE INFORMATION DETECTING UNIT

12031 IMAGING SECTION

12040 IN-VEHICLE INFORMATION DETECTING UNIT

12041 DRIVER STATE DETECTING SECTION

SOLID-STATE IMAGING ELEMENT AND METHOD OF MANUFACTURING SAME

CROSS REFERENCE TO RELATED APPLICATIONS

This application is a U.S. National Phase of International Patent Application No. PCT/JP2021/041198 filed on Nov. 9, 2021, which claims priority benefit of Japanese Patent Application No. JP 2020-212372 filed in the Japan Patent Office on Dec. 22, 2020. Each of the above-referenced applications is hereby incorporated herein by reference in its entirety.

TECHNICAL FIELD

The present disclosure relates to a solid-state imaging element and a method of manufacturing the same.

BACKGROUND ART

In a complementary metal oxide semiconductor (CMOS) image sensor, a plurality of pixels arranged in a pixel array section includes a transfer transistor, an amplification transistor, a selection transistor, and the like (hereinafter, they are also collectively referred to as pixel transistors) in order to amplify and output photoelectrically converted charges.

A buried gate structure in which a gate electrode is buried from a surface of a semiconductor substrate may be used for the pixel transistor. By employing the buried gate structure, a channel area is increased, and noise can be reduced and a reading speed can be improved.

CITATION LIST

Patent Document

Patent Document 1: Japanese Patent Application Laid-Open No. 2013-125862

Patent Document 2: Japanese Patent Application Laid-Open No. 2017-183636

Patent Document 3: International Publication No. 2013/094430

Patent Document 4: Japanese Patent Application Laid-Open No. 2015-53411

Patent Document 5: Japanese Patent Application Laid-Open No. 2006-121093

SUMMARY OF THE INVENTION

Problems to be Solved by the Invention

On the other hand, when a parasitic capacitance of the gate of the amplification transistor increases, conversion efficiency at the time of amplifying the pixel charge decreases, and the signal/noise (S/N) ratio deteriorates. Therefore, when the parasitic capacitance of the gate increases due to the buried gate structure, the S/N ratio also deteriorates.

Accordingly, the present disclosure provides a solid-state imaging element capable of reducing a parasitic capacitance of a gate while increasing a channel area of a pixel transistor.

Solutions to Problems

A solid-state imaging element according to one aspect of the present disclosure is a solid-state imaging element including a plurality of pixels that photoelectrically converts incident light, the solid-state imaging element including a substrate on which the plurality of pixels is provided, a first transistor provided in each of the plurality of pixels and including a first gate electrode portion embedded in a first direction from a first surface of the substrate toward a second surface of the substrate opposite to the first surface, a first gate insulating film provided between an active region of the substrate in which a channel of the first transistor is formed and a first side surface of the first gate electrode portion facing the active region, and a first insulating film provided on a second side surface of the first gate electrode portion other than the first side surface and thicker than the first gate insulating film, in which a depth of the first insulating film from the first surface to the second surface of the substrate is substantially same as or deeper than a depth of the first gate electrode portion, and a width of an upper surface of the first gate electrode portion is wider than a width of a bottom surface of the first gate electrode portion in a cross section in the first direction.

The first transistor further includes a second gate electrode portion embedded from the first surface toward the second surface of the substrate and electrically connected to the first gate electrode portion, and the first gate electrode portion and the second gate electrode portion face each other with the active region interposed therebetween, and the solid-state imaging element further includes a second gate insulating film provided between the active region and the second gate electrode portion.

The first transistor further includes an upper gate electrode portion provided on an upper surface of the active region between the first gate electrode portion and the second gate electrode portion and connecting between the first gate electrode portion and the second gate electrode portion, and the solid-state imaging element further includes an upper gate insulating film provided between the upper surface of the active region and the upper gate electrode portion.

Assuming that a direction substantially perpendicular to a channel length direction of the first transistor in a plane substantially parallel to the first surface of the substrate is a first direction, a width of a source or a drain of the first transistor in the first direction is substantially equal to a width of the active region in the first direction.

Assuming that a direction substantially perpendicular to a channel length direction of the first transistor in a plane substantially parallel to the first surface of the substrate is a first direction, a width of a source or a drain of the first transistor in the first direction is wider than a width of the active region in the first direction, and the solid-state imaging element further includes a second insulating film that is provided between a source or a drain of the first transistor and the first gate electrode portion and is thicker than the first gate insulating film.

The upper gate electrode portion is not provided above the source or the drain of the first transistor.

The first transistor further includes a second gate electrode portion embedded from the first surface toward the second surface of the substrate, and a third gate electrode portion embedded from the first surface toward the second surface of the substrate, provided between the first gate electrode portion and the second gate electrode portion, and electrically connected to the first and second gate electrode portions, the first gate electrode portion and the third gate electrode portion face each other with a first active region portion of the active region interposed therebetween, and the second gate electrode portion and the third gate electrode portion face each other with a second active region portion of the active region interposed therebetween, and the solid-state imaging element further includes a second gate insulating film provided between the second active region portion and the second gate electrode portion, a third gate insulating film provided between the first active region portion and the third gate electrode portion, and a fourth gate insulating film provided between the second active region portion and the third gate electrode portion.

The first transistor further includes a second gate electrode portion embedded from the first surface toward the second surface of the substrate, and a plurality of third gate electrode portions embedded from the first surface toward the second surface of the substrate, provided between the first gate electrode portion and the second gate electrode portion, and electrically connected to the first and second gate electrode portions.

The first transistor further includes an upper gate electrode portion provided on upper surfaces of the first and second active regions and connecting the first to third gate electrode portions, and the solid-state imaging element further includes an upper gate insulating film provided between the upper surfaces of the first and second active regions and the upper gate electrode portion.

Assuming that a direction substantially perpendicular to a channel length direction of the first transistor in a plane substantially parallel to the first surface of the substrate is a first direction, a width of the upper gate electrode portion in the first direction is wider than a sum of widths of the first and second active regions in the first direction.

A thickness of the first gate insulating film is equal to or more than 1 nm and less than 20 nm, and a thickness of the first insulating film is equal to or more than 20 nm.

In a cross section in a direction from the first surface toward the second surface of the substrate, a width of an upper surface of the active region is narrower than a width of a bottom surface of the active region.

A channel length of the first transistor is equal to or more than 200 nm.

A width of the upper surface of the active region in the first direction is equal to or more than 20 nm and equal to or less than 200 nm.

A depth from the first surface of the substrate to a bottom surface of the first gate electrode portion is equal to or more than 100 nm.

The first transistor is applied to an amplification transistor that amplifies a signal charge accumulated in a photodiode of the pixels.

The first transistor is applied to at least one of a transfer transistor that transfers a signal charge accumulated in a photodiode of the pixels, a reset transistor that eliminates a signal charge of the photodiode, or a selection transistor that selectively connects the pixels to a vertical signal line.

A method of manufacturing a solid-state imaging element including a plurality of pixels that photoelectrically converts incident light, the method including forming a first trench in a first surface of a substrate, forming a gate insulating film on an inner wall of the first trench, embedding an element isolation film in the first trench, forming a second trench by processing the element isolation film in such a manner that the gate insulating film in a channel region of an inner wall of the first trench in which a channel is formed is exposed, and embedding a gate electrode in the second trench.

BRIEF DESCRIPTION OF DRAWINGS

FIG. 1 is a block diagram depicting a configuration example of an embodiment of a solid-state imaging element to which the present technology is applied.

FIG. 4A is a plan view depicting a configuration example of an amplification transistor according to the first embodiment.

FIG. 5A is a plan view depicting a configuration example of an amplification transistor 34 according to a second embodiment.

FIG. 6A is a plan view depicting a configuration example of an amplification transistor according to a third embodiment.

FIG. 6B is a cross-sectional view taken along line B-B in FIG. 6A.

FIG. 7A is a plan view depicting a configuration example of an amplification transistor according to a fourth embodiment.

FIG. 8A is a plan view depicting a configuration example of an amplification transistor according to a fifth embodiment.

FIG. 8B is a cross-sectional view taken along line C-C in FIG. 8A.

FIG. 12 is a plan view depicting a configuration example of an amplification transistor according to a ninth embodiment.

FIG. 13 is a cross-sectional view depicting an example of a method of manufacturing an amplification transistor according to a third embodiment.

FIG. 15 is a cross-sectional view depicting an example of a manufacturing method subsequent to FIG. 13.

FIG. 19 is a block diagram depicting a schematic configuration example of a vehicle control system which is an example of a moving body control system according to the present disclosure.

MODE FOR CARRYING OUT THE INVENTION

Figure 2:
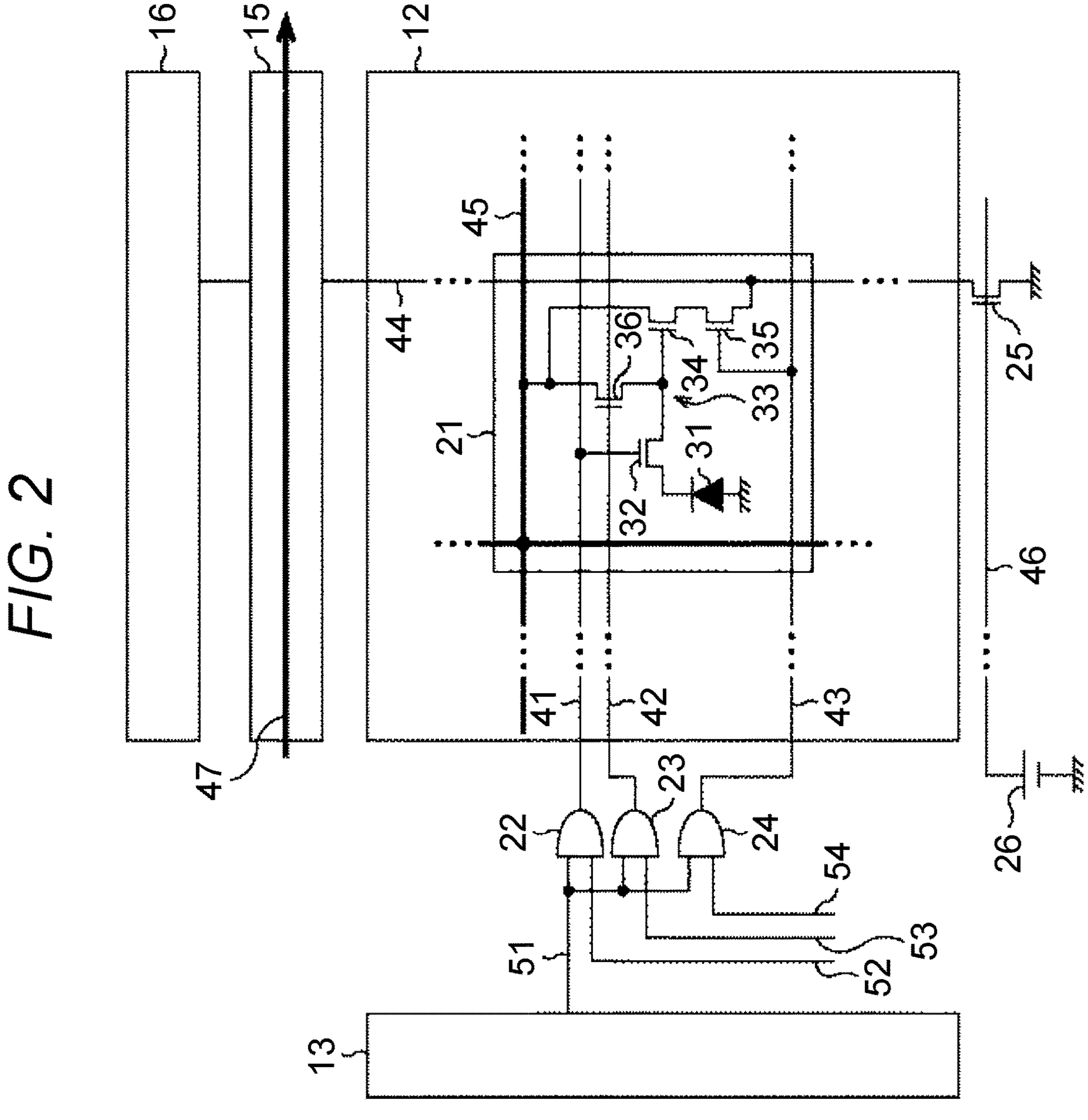
FIG. 2 is a diagram depicting a pixel and a peripheral circuit of a pixel array section.

Hereinafter, specific embodiments to which the present technology is applied will be described in detail with reference to the drawings. The drawings are schematic or conceptual, and the ratio of each portion and the like are not necessarily the same as actual ones. In the description and the drawings, elements similar to those described above with respect to previously described drawings are denoted by the same reference numerals, and detailed descriptions thereof are appropriately omitted.

First Embodiment

FIG. 1 is a block diagram depicting a configuration example of an embodiment of a solid-state imaging element to which the present technology is applied.

In FIG. 1, a solid-state imaging element 11 is a CMOS solid-state imaging element (CIS), and includes a pixel array section 12, a vertical drive circuit 13, a shutter drive circuit 14, a correlated double sampling (CDS) circuit 15, a horizontal drive circuit 16, an automatic gain controller (AGC) 17, an analog-to-digital (A/D) converter 18, and a timing generator 19. The solid-state imaging element 11 may be a front-illuminated CIS or a back-illuminated CIS.

The pixel array section 12 includes a plurality of pixels (for example, the pixel 21 of FIG. 3) arranged two-dimensionally, and each pixel is provided on a semiconductor substrate and includes one or more photoelectric conversion elements that photoelectrically converts incident light. Furthermore, in the pixel array section 12, a plurality of signal wirings for supplying a signal from the vertical drive circuit 13 to each pixel is connected for each row, and a plurality of signal wirings for outputting a pixel signal from each pixel to the CDS circuit 15 is connected for each column.

The vertical drive circuit 13 sequentially supplies signals for selecting the plurality of pixels included in the pixel array section 12 in each row via signal wiring.

The shutter drive circuit 14 sequentially supplies a drive signal for performing shutter drive in each row of the plurality of pixels included in the pixel array section 12. For example, an exposure time (charge accumulation time) of the pixel can be adjusted by adjusting the interval between the drive signal output from the shutter drive circuit 14 and the signal output from the vertical drive circuit 13.

The CDS circuit 15 reads out pixel signals from the pixels of the row selected by the signal from the vertical drive circuit 13, and performs CDS processing. That is, the CDS circuit 15 performs processing of obtaining a difference between the pixel signal corresponding to the level at which a charge is accumulated in each pixel and the pixel signal of a reset level of each pixel, thereby acquiring a signal indicating a pixel value from which a fixed pattern noise for each pixel has been removed. Then, the CDS circuit 15 sequentially outputs a signal indicating the acquired pixel value to the AGC 17 according to the drive signal from the horizontal drive circuit 16.

The horizontal drive circuit 16 sequentially selects the pixels included in the pixel array section 12 in the column direction, and outputs a drive signal for outputting a signal indicating a pixel value to the CDS circuit 15.

The AGC 17 amplifies the signal indicating the pixel value supplied from the CDS circuit 15 with an appropriate gain and outputs the amplified signal to the A/D conversion section 18.

The A/D conversion section 18 outputs pixel data obtained by converting an analog signal supplied from the AGC 17 into a digital numerical value to the outside of the solid-state imaging element 11.

The timing generator 19 generates a signal indicating timing necessary for driving each block of the solid-state imaging element 11 on the basis of a clock signal of a predetermined frequency, and supplies the signal to each block.

Furthermore, in FIG. 1, the flow of the signal output from the pixel is indicated by a thick arrow, and the signal output from the pixel array section 12 is subjected to the CDS processing in the CDS circuit 15, then amplified in the AGC 17, A/D converted in the A/D conversion section 18, and output to the outside.

Note that FIG. 1 depicts an example of a configuration of the solid-state imaging element 11, and for example, a configuration in which the A/D conversion section 18 is not provided inside the solid-state imaging element 11, a configuration in which the A/D conversion section is provided for each column of pixels, or the like can be employed. Furthermore, the solid-state imaging element 11 may have a configuration including a plurality of output systems by including one or more CDS circuits 15 or providing a plurality of AGCs 17 and A/D conversion sections 18.

Next, pixels and a peripheral circuit of the pixel array section 12 will be described with reference to FIG. 2.

As described above, a plurality of pixels is two-dimensionally arranged in the pixel array section 12, but in FIG. 2, one pixel 21 among them is illustrated, and illustration of the other pixels is omitted for simplification. Furthermore, as depicted in FIG. 2, the peripheral circuit of the pixel array section 12 includes AND elements 22 to 24 arranged for each row of the pixels 21, a transistor 25 arranged for each column of the pixels 21, and a constant potential source 26.

The pixel 21 includes a PD 31, a transfer transistor 32, an FD 33, an amplification transistor 34, a selection transistor 35, and a reset transistor 36. Further, to the pixel 21, a transfer signal wiring 41, a reset signal wiring 42, and a selection signal wiring 43 that supply a signal common to the pixels 21 arranged in the row direction are connected, and a pixel output wiring 44 that outputs a pixel signal to the CDS circuit 15 is connected. Furthermore, a predetermined power supply potential is supplied to the pixel 21 via the power supply potential supply wiring 45.

The PD 31 is a photoelectric conversion element that photoelectrically converts light applied to the pixel 21 to generate a charge and accumulates the charge.

The transfer transistor 32 transfers the charge accumulated in the PD 31 to the FD 33 according to the transfer signal supplied via the transfer signal wiring 41.

The FD 33 is a floating diffusion region formed at a connection point between the transfer transistor 32 and the gate electrode of the amplification transistor 34, and temporarily accumulates the charge transferred from the PD 31 via the transfer transistor 32. That is, the potential of the gate electrode of the amplification transistor 34 increases according to the charge accumulated in the FD 33.

The amplification transistor 34 has a drain connected to the power supply potential supply wiring 45, and converts the charge accumulated in the FD 33 into a pixel signal at a level corresponding to the potential and outputs the pixel signal.

A selection signal for selecting the pixel 21 that outputs the pixel signal is supplied to the selection transistor 35 via the selection signal wiring 43, and the selection transistor 35 connects the amplification transistor 34 to the pixel output wiring 44 according to the selection signal.

The reset transistor 36 has a drain connected to the power supply potential supply wiring 45, and resets the charge accumulated in the FD 33 according to a reset signal supplied via the reset signal wiring 42.

The transistor 25 supplies a constant current to the pixel output wiring 44. That is, by the constant current being supplied from the transistor 25 to the amplification transistor 34 of the pixel 21 in which the output of the pixel signal is selected, the amplification transistor 34 operates as a source follower. Thus, a potential having a predetermined constant voltage difference from the gate potential of the amplification transistor 34 appears in the pixel output wiring 44.

The constant potential source 26 supplies a constant potential to the gate electrode of the transistor 25 via a constant potential supply wiring 46 so that the transistor 25 performs a saturation region operation in order to supply a constant current.

The output terminal of the AND element 22 is connected to the gate electrode of the transfer transistor 32 via the transfer signal wiring 41. Furthermore, in the AND element 22, one input terminal is connected to the output terminal of the vertical drive circuit 13 via a signal wiring 51, and the other input terminal is connected to a terminal that outputs a pulse-shaped transfer signal according to the drive timing via a signal wiring 52.

An output terminal of the AND element 23 is connected to a gate electrode of the reset transistor 36 via the reset signal wiring 42. Furthermore, in the AND element 23, one input terminal is connected to the output terminal of the vertical drive circuit 13 via the signal wiring 51, and the other input terminal is connected to a terminal that outputs a pulse-shaped reset signal according to the drive timing via the signal wiring 53.

An output terminal of the AND element 24 is connected to a gate electrode of the selection transistor 35 via the selection signal wiring 43. Furthermore, in the AND element 24, one input terminal is connected to the output terminal of the vertical drive circuit 13 via the signal wiring 51, and the other input terminal is connected to a terminal that outputs a pulse-shaped selection signal according to the drive timing via a signal wiring 54.

With such a configuration, in the solid-state imaging element 11, the transfer signal, the reset signal, and the selection signal are supplied to the pixels 21 arranged in the row selected by the vertical drive circuit 13 via the transfer signal wiring 41, the reset signal wiring 42, and the selection signal wiring 43, respectively.

Next, drive signals supplied to the pixel 21 will be described with reference to FIG. 3.

Figure 3:
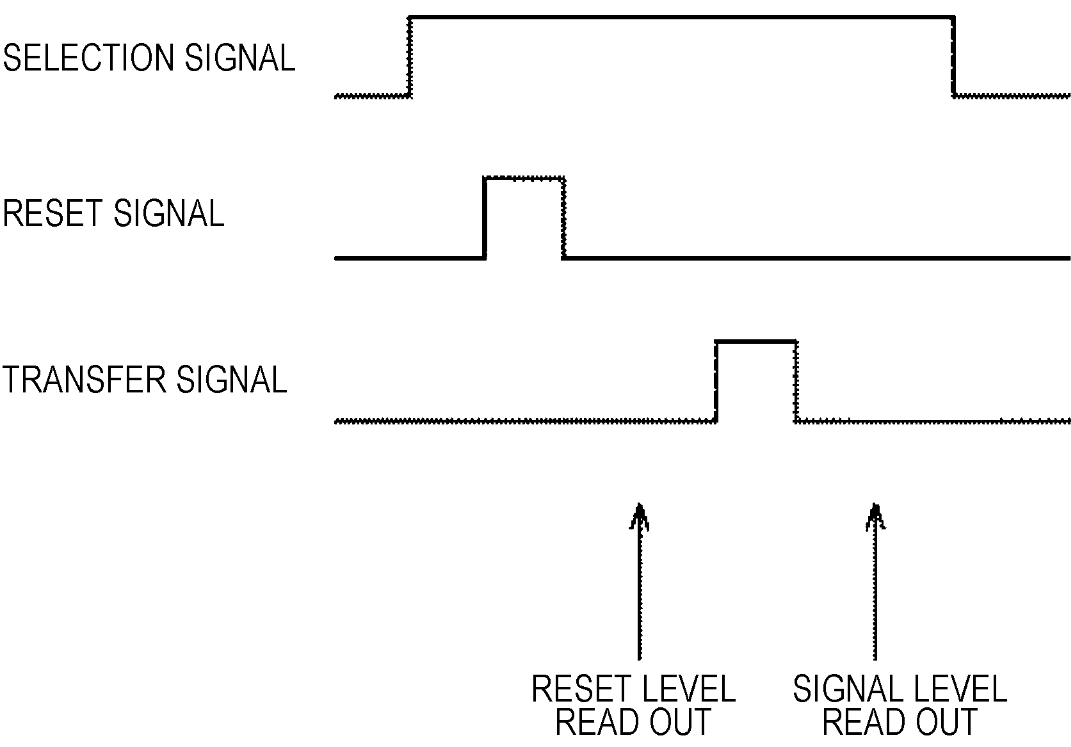
FIG. 3 is a diagram depicting drive signals supplied to a pixel.

The selection signal depicted in FIG. 3 is supplied to the selection transistor 35 via the selection signal wiring 43, the reset signal is supplied to the reset transistor 36 via the reset signal wiring 42, and the transfer signal is supplied to the transfer transistor 32 via the transfer signal wiring 41.

At the timing when the reading period for reading out the pixel signal from the pixel 21 is started, the selection signal becomes a high level, and the selection transistor 35 becomes conductive, whereby it is possible to output the signal of the pixel 21 to the CDS circuit 15 via the pixel output wiring 44.

Thereafter, the reset signal becomes a high level, and the reset transistor 36 becomes conductive, whereby the charge accumulated in the FD 33 is reset. Then, by the reset signal becoming a low level, the reset transistor 36 becomes non-conductive and the reset is completed, and then the pixel signal at the reset level is read out to the CDS circuit 15.

Next, by the transfer signal becoming a high level, the transfer transistor 32 becomes conductive, and the charge accumulated in the PD 31 is transferred to the FD 33. Then, by the transfer signal becoming a low level, the transfer transistor 32 becomes non-conductive and the transfer of the charge is completed, and then the pixel signal corresponding to the level of the charge accumulated in the FD 33 is read out to the CDS circuit 15.

In this manner, in the solid-state imaging element 11, the pixel signal at the reset level and the pixel signal corresponding to the level of the charge accumulated in the FD 33 are read out to the CDS circuit 15. Then, the CDS circuit 15 performs the CDS processing, thereby canceling a fixed pattern noise generated due to variations in the threshold voltage of the amplification transistor 34 of each pixel 21, or the like.

Furthermore, the CDS circuit 15 outputs a signal indicating the pixel value of the pixel 21 in the column selected by the horizontal drive circuit 16 to the AGC 17 in FIG. 1 through the horizontal signal wiring 47.

Figure 4A:
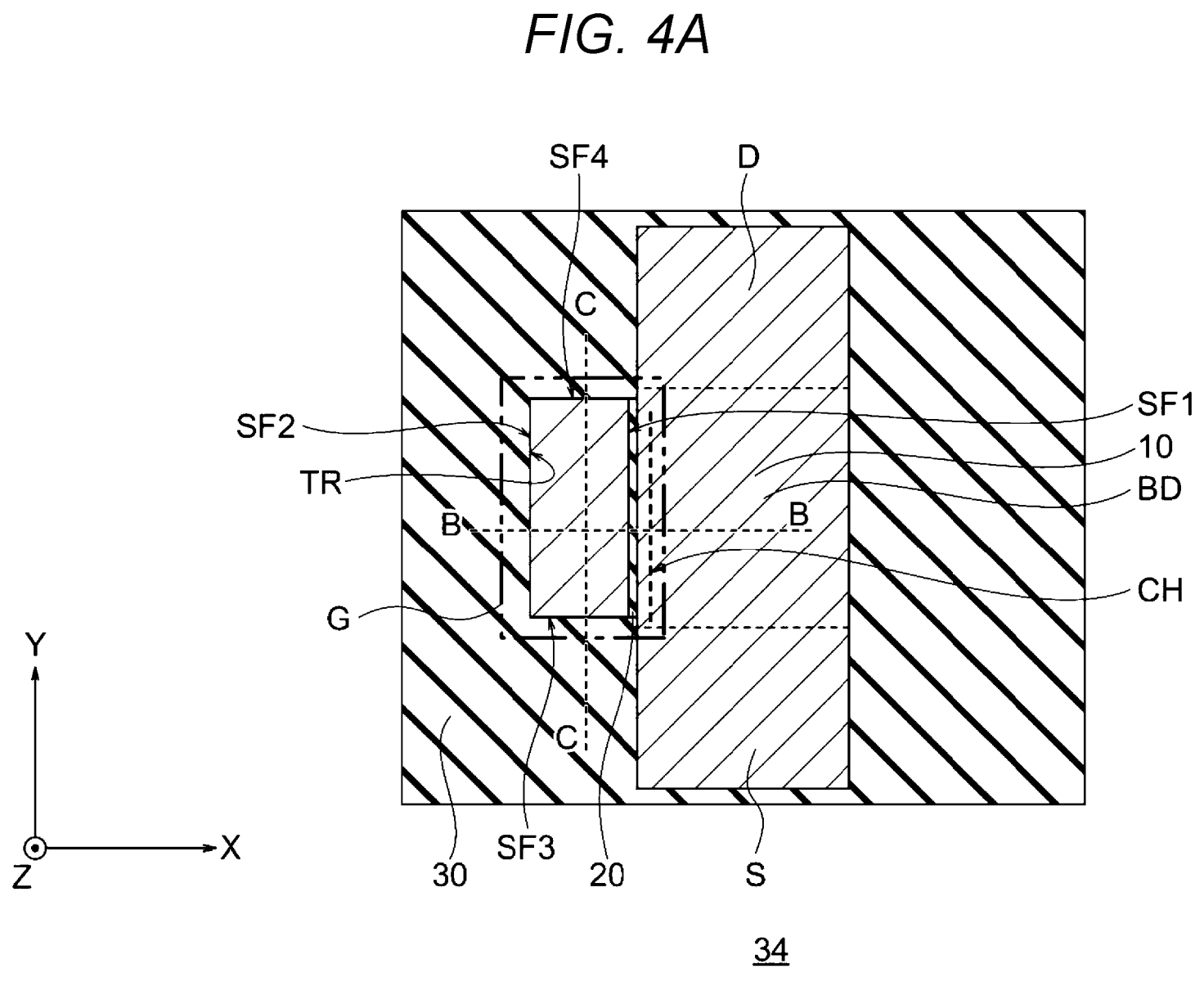
Figure 4B:
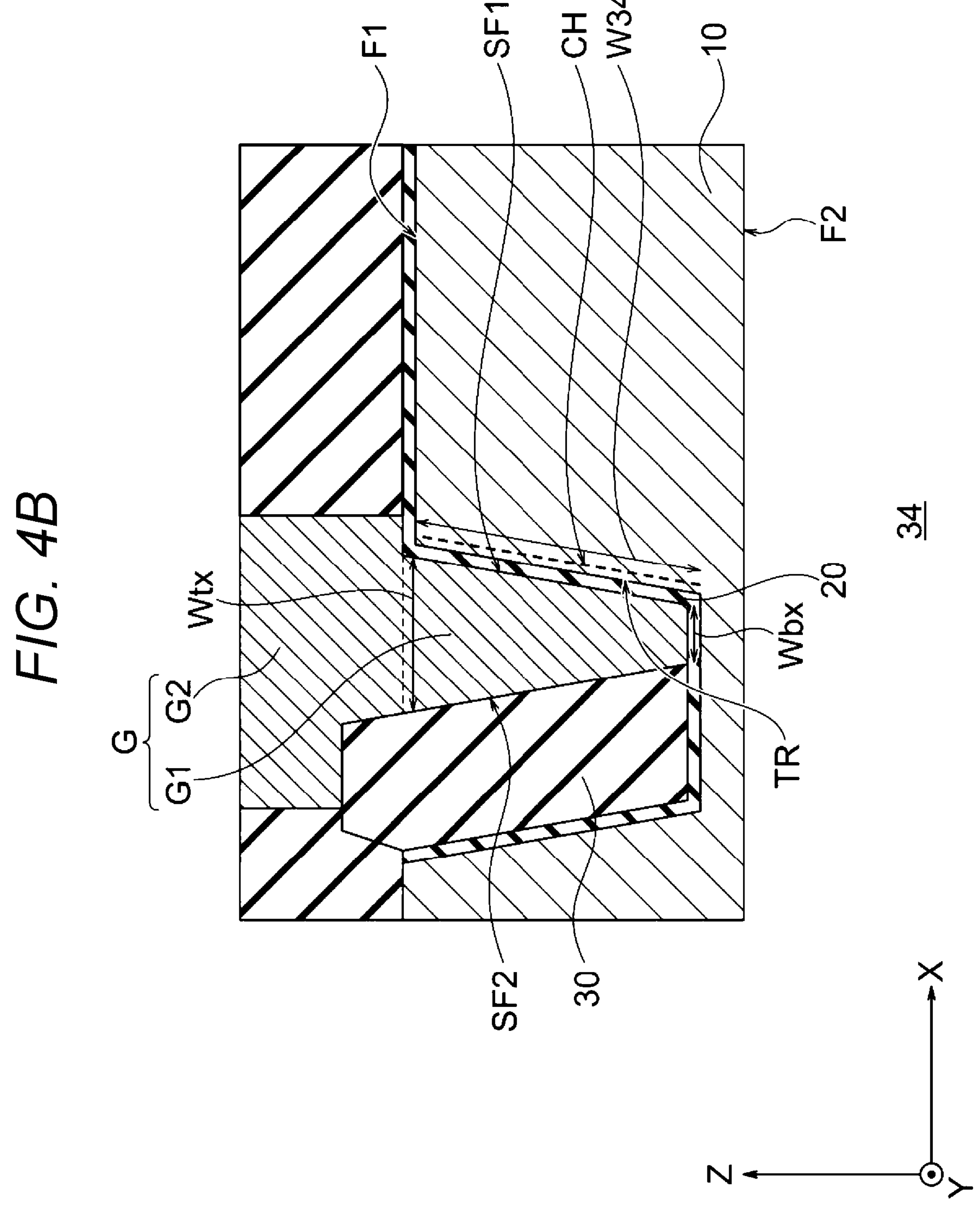
FIG. 4B is a cross-sectional view taken along line B-B in FIG. 4A.
Figure 4C:
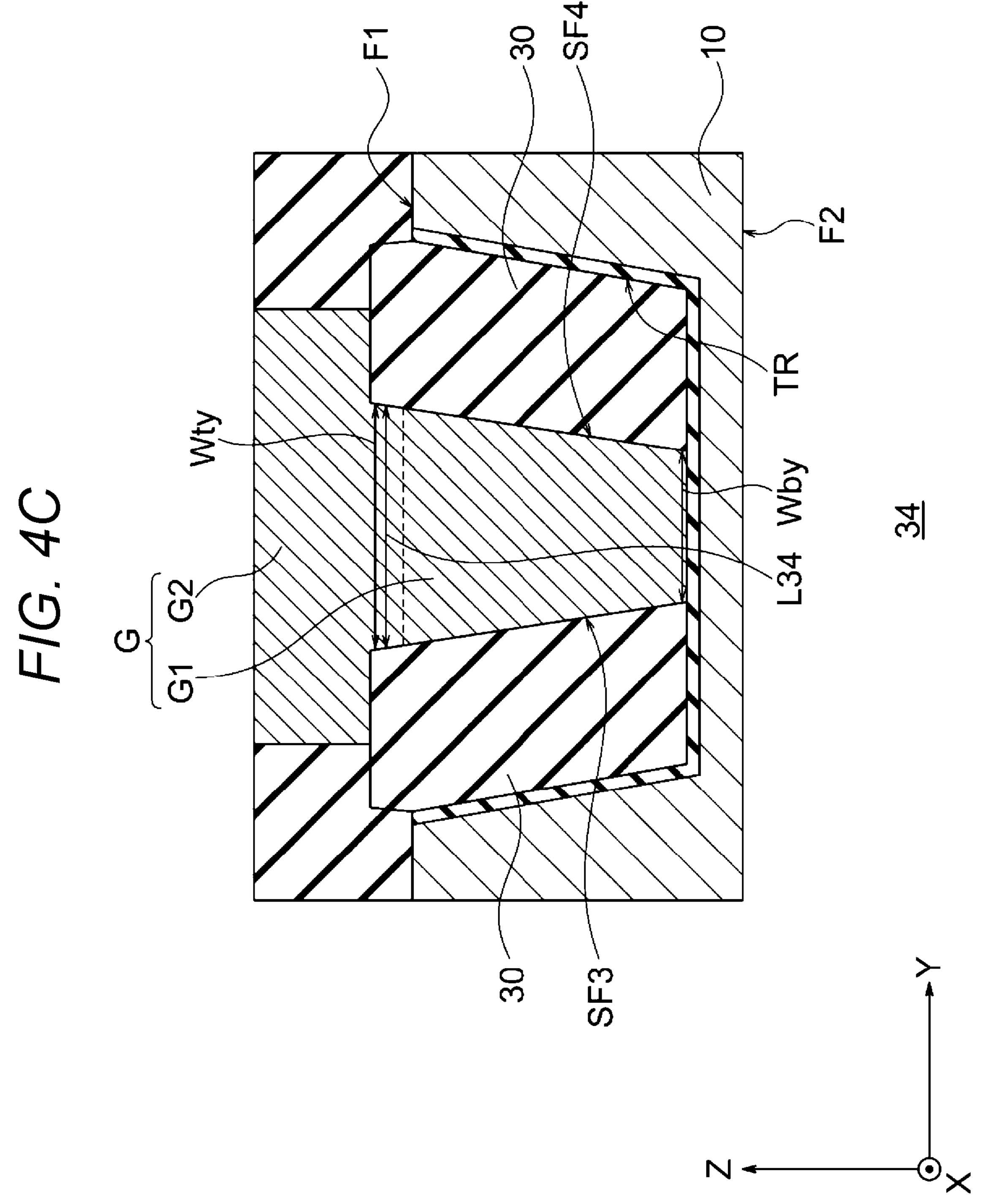
FIG. 4C is a cross-sectional view taken along line C-C in FIG. 4A.

FIG. 4A is a plan view depicting a configuration example of the amplification transistor 34 according to the first embodiment. FIG. 4A depicts a planar configuration example of the amplification transistor 34, FIG. 4B depicts a cross-sectional view taken along line B-B of FIG. 4A, and FIG. 4C depicts a cross-sectional view taken along line C-C of FIG. 4A. Note that a direction perpendicular to a first surface F1 of the semiconductor substrate 10 is defined as a Z direction, and a direction orthogonal to the Z direction is defined as an X direction or a Y direction. The Y direction is a channel length direction of the amplification transistor 34 in a plane parallel to the first surface F1, and the X direction is a direction orthogonal to the Y direction (direction orthogonal to the Y and Z directions) in a plane parallel to the first surface F1.

The amplification transistor 34 is a Fin-type transistor provided on the semiconductor substrate 10. The semiconductor substrate 10 may be, for example, a silicon substrate. The amplification transistor 34 includes a gate electrode G, a source region S, and a drain region D. The source region S and the drain region D includes an impurity diffusion layer provided on the surface of the semiconductor substrate 10. The source region S is provided on one side in the channel length direction of the amplification transistor 34, and the drain region D is provided on the other side.

The channel region CH is provided in a body region BD between the source region S and the drain region D. The body region BD as an active region is a region of the semiconductor substrate 10 between the source region S and the drain region D, and has a Fin shape protruding in a direction (Z direction) substantially perpendicular to the first surface F1 of the semiconductor substrate 10. The channel region CH is provided on a side surface of the body region BD facing the gate electrode G. In the present embodiment, the source region S and the drain region D have a width substantially equal to that of the body region BD where the channel region CH exists. That is, in the X-Y plane substantially parallel to the first surface F1 of the semiconductor substrate 10, the widths in the X direction of the source region S and the drain region D of the amplification transistor 34 are substantially equal to a width of the body region BD in the X direction. Therefore, the source region S, the drain region D, and the body region BD have a substantially rectangular shape when viewed from above the front surface of the semiconductor substrate 10 (when viewed from the Z direction). The gate electrode G faces one side surface of the body region BD. Accordingly, the channel region CH is also provided on one side surface of the body region.

As depicted in FIGS. 4B and 4C, the gate electrode G is embedded in a trench TR engraved from the first surface F1 of the semiconductor substrate 10. That is, a lower portion (first gate electrode portion) G1 of the gate electrode G is embedded in the trench TR engraved from the first surface F1 of the semiconductor substrate 10 toward a second surface F2 opposite to the first surface F1. The depth of the trench TR is, for example, equal to or more than about 100 nm. Therefore, the depth from the first surface F1 to the bottom surface of a lower portion G1 is also equal to or more than about 100 nm. An upper portion (upper gate electrode portion) G2 of the gate electrode G is provided on the lower portion G1 and is provided integrally with the lower portion G1. The channel region CH is provided in a facing region of the semiconductor substrate 10 facing the gate electrode G via the gate insulating film 20. The channel region CH is inverted by the voltage of the gate electrode G, and conducts between the source region S and the drain region D. That is, the channel of the amplification transistor 34 is formed on a first side surface SF1 of the lower portion G1 of the gate electrode G. Since the current flows between the source and the drain, the current flows in the Y direction (or −Y direction) in FIGS. 4B and 4C. Therefore, the length (width) of the channel region CH depicted in FIG. 4B is a channel width W34. The width (length) of the lower portion G1 of the gate electrode G in FIG. 4C is a channel length L34. The channel length L34 is, for example, equal to or more than about 200 nm.

The lower portion G1 of the gate electrode G becomes narrower in the X direction and the Y direction as it becomes deeper in the −Z direction from the first surface F1 to the second surface F2. That is, the lower portion G1 is formed in a rectangular shape or a wedge shape tapered from the first surface F1 toward the second surface F2. Accordingly, the channel length L34 also gradually decreases from the first surface F1 toward the second surface F2. Therefore, in the longitudinal cross section in the Z direction depicted in FIGS. 4A and 4B, widths Wtx and Wty of the upper surface of the lower portion G1 of the lower portion G1 are wider than widths Wbx and Wby of the bottom surface of the lower portion G1.

The gate insulating film 20 is provided between the body region BD where the channel of the amplification transistor 34 is formed and the first side surface SF1 of the gate electrode G facing the body region BD. Furthermore, the gate insulating film 20 is interposed between the gate electrode G and the semiconductor substrate 10 at the bottom of the trench TR. Moreover, the gate insulating film 20 is also interposed between the upper portion G2 of the gate electrode G and the semiconductor substrate 10. Thus, the gate insulating film 20 electrically isolates the gate electrode G from the semiconductor substrate 10. For the gate insulating film 20, for example, a silicon oxide film, a high dielectric material (for example, a hafnium oxide film) or the like having a higher relative dielectric constant than the silicon oxide film, or the like may be used.

In the trench TR, in addition to the lower portion G1 of the gate electrode G, a shallow trench isolation (STI) 30 as a first insulating film is provided. As depicted in FIG. 4B, in the trench TR, the STI 30 contacts a second side surface SF2 opposite to the first side surface SF1 of the lower portion G1. As depicted in FIG. 4C, the STI 30 also contacts side surfaces SF3 and SF4 of the lower portion G1 facing the Y direction in the trench TR. That is, the STI 30 covers the three side surfaces SF2 to SF4 other than the first side surface SF1 of the lower portion G1 of the gate electrode G. The STI 30 is thicker than gate insulating film 20, and is provided to a depth substantially equal to or deeper than gate insulating film 20. For the STI 30, for example, an insulating material such as a silicon oxide film is used.

In the present disclosure, as depicted in FIG. 4A, the trench TR and the gate electrode G have a substantially rectangular shape when viewed from the Z direction, and the STI 30 covers three side surfaces (second side surfaces) SF2 to SF4 other than the first side surface SF1 of the lower portion G1. However, in a case where the trench TR and the gate electrode G have other polygonal shapes, circular shapes, semicircular shapes, and elliptical shapes, the STI 30 is provided on a side surface other than the side surface of the gate electrode G facing the channel region CH. Even if the trench TR and the gate electrode G have shapes other than the rectangular shape, the gate insulating film 20 is provided on the side surface of the gate electrode G facing the channel region CH. A thickness of the STI 30 is thicker than that of the gate insulating film 20 in each of the X direction, the Y direction, and the Z direction. A thickness of the gate insulating film 20 is, for example, equal to or more than about 1 nm and less than about 20 nm, and the thickness of the STI 30 is, for example, equal to or more than about 20 nm. Therefore, the distance between the side surfaces SF2 to SF4 of the gate electrode G facing the semiconductor substrate 10 other than the channel region CH and the semiconductor substrate 10 is larger than the distance between the first side surface SF1 of the gate electrode G facing the channel region CH and the semiconductor substrate 10.

As described above, in the present disclosure, the lower portion G1 of the gate electrode G is covered with the gate insulating film 20 on the first side surface SF1 facing the channel region CH of the body region BD, and covered with the STI 30 thicker than the gate insulating film 20 on the side surfaces SF2 to SF4 other than the first side surface SF1. Thus, a parasitic capacitance of the gate electrode G is very small on the side surfaces SF2 to SF4 other than the first side surface SF1 facing the channel region CH. When the parasitic capacitance of the gate electrode G decreases, conversion efficiency at the time of amplifying the pixel charge is improved, and the S/N ratio is improved. Further, the operation speed of the amplification transistor 34 can be increased. Furthermore, in the present disclosure, the Fin-type transistor is used as the amplification transistor 34. Thus, a relatively large current can flow while reducing the layout area of the amplification transistor 34.

Note that, when the parasitic capacitance of the gate electrode G of the amplification transistor 34 increases, the conversion efficiency of the amplification transistor 34 decreases and a noise component increases. The conversion efficiency is a conversion coefficient of a voltage value per charge (for example, an electron) when electrons photoelectrically converted by the photodiode PD are transferred to the FD 33 via the transfer transistor 32 and converted into a voltage. As the numerical value of the conversion efficiency is larger, one charge can be converted into a larger voltage value. Since the converted voltage signal is subjected to signal processing such as A/D conversion via the output wiring 44, the larger the voltage signal, the better the S/N ratio such as signal processing, and the lower the noise. The conversion efficiency CG is expressed by Expression 1.

$$CG=q\cdot G_{SF}/C_{SN}+C_{GD}+(1-G_{SF})C_{GS} \quad \text{(Expression 1)}$$

where q is an elementary quantity. $G_{SF}$ is a gain of the source follower circuit connected to the output wiring 44. $C_{SN}$ is a parasitic capacitance component of the reset transistor 36, the transfer transistor 32, the amplification transistor 35, the wiring, and the like in the capacitance of the FD 33, and $C_{SD}$ is a gate-drain capacitance of the amplification transistor 35. $C_{GS}$ is a gate-source capacitance of the amplification transistor 35. In a case where the gate electrode G is embedded, the parasitic capacitance component of the amplification transistor 35 includes the capacitance between another element or diffusion region disposed via an insulating material such as the STI 30 and the gate electrode G, and the capacitance between a well region in contact with the gate electrode G via the insulating material or the gate oxide film and the gate electrode G.

The transistor of the present disclosure is applied to the amplification transistor 34, but can be applied to any of the other transfer transistor 32, the reset transistor 36, and the selection transistor 35. Furthermore, the transistor of the present disclosure may be applied to two or more transistors of the amplification transistor 34, the transfer transistor 32, the reset transistor 36, and the selection transistor 35. Thus, each of the transistors 32 and 33 to 36 can pass a relatively large current while reducing the layout area of the pixel.

Figure 5A:
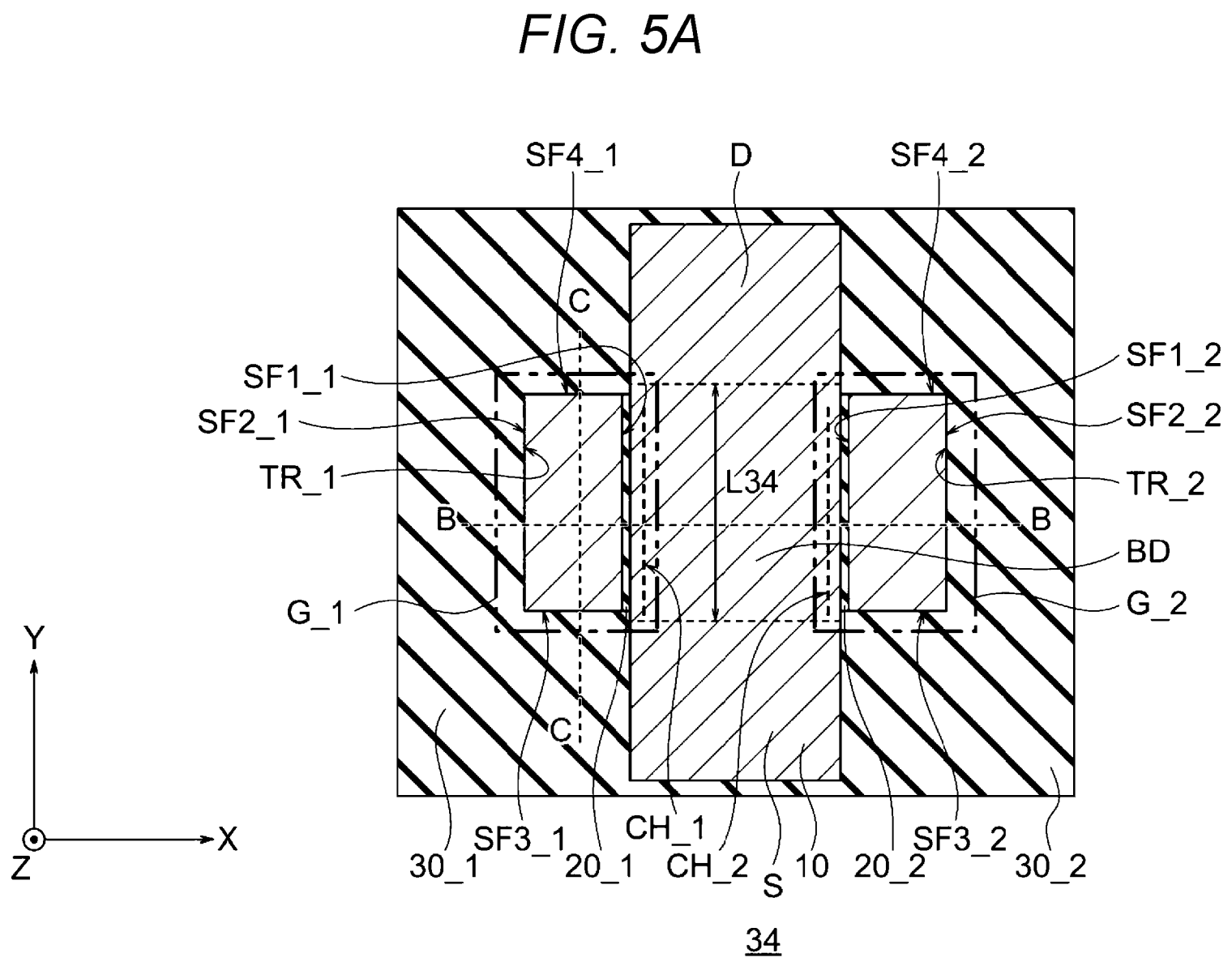
Figure 5B:
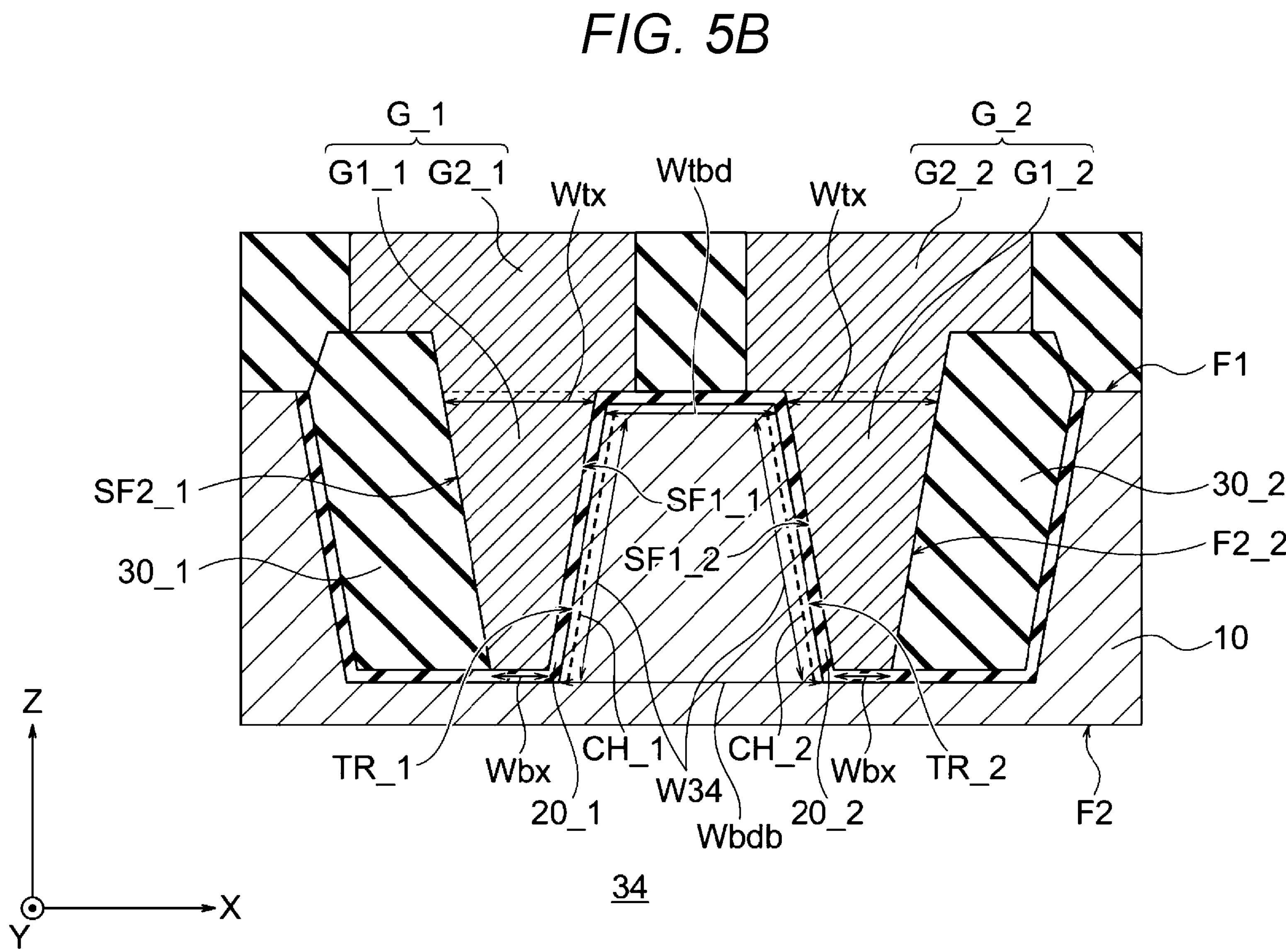
FIG. 5B is a cross-sectional view taken along line B-B in FIG. 5A.

(Second Embodiment) FIG. 5A is a plan view depicting a configuration example of the amplification transistor 34 according to a second embodiment. FIG. 5A depicts a planar configuration example of the amplification transistor 34, and FIG. 5B depicts a cross-sectional view taken along line B-B of FIG. 5A. Note that the cross section taken along line C-C in FIGS. 5A and 5B may be the same as the cross section depicted in FIG. 4C.

The second embodiment is different from the first embodiment in that gate electrodes G_1 and G_2 are provided on both sides (both side surfaces) of a body region BD. The gate electrode G_1 may have the same configuration as the gate electrode G of the first embodiment. The gate electrode G_2 basically has the same configuration as the gate electrode G_1, but is symmetric with respect to the gate electrode G_1 across the body region BD (line-symmetric with respect to the Z axis).

Channel regions CH_1 and CH_2 are provided respectively on both side surfaces of the body region BD in the X direction. The channel region CH_1 is provided on one side surface of the body region BD facing the gate electrode G_1, and the channel region CH_2 is provided on the other side surface of the body region BD facing the gate electrode G_2. The source region S and the drain region D are provided in common to the channel regions CH_1 and CH_2. That is, the gate electrodes G_1 and G_2 are commonly connected to the FD 33, and are driven to the same voltage at the same timing. The gate electrodes G_1 and G_2 face both side surfaces of the body region BD. Accordingly, the channel regions CH_1 and CH_2 are also provided on both side surfaces of the body region BD.

A lower portion G1_1 of the gate electrode G_1 is embedded in a trench TR_1 engraved from the first surface F1 of the semiconductor substrate 10 toward the second surface F2 on the opposite side of the first surface F1. An upper portion G2_1 of the gate electrode G_1 is provided on the lower portion G1_1 and is provided integrally with the lower portion G1_1. The channel region CH_1 is provided in a facing region of the semiconductor substrate 10 facing the gate electrode G_1 via a gate insulating film 20_1.

The lower portion G1_1 of the gate electrode G_1 is formed in a rectangular shape or a wedge shape tapered from the first surface F1 toward the second surface F2. The channel length L34 and the channel width W34 are gradually shorter or narrower from the first surface F1 toward the second surface F2.

The gate insulating film 20_1 is provided between the body region BD and a first side surface SF1_1 of the gate electrode G_1. Furthermore, the gate insulating film 20_1 is interposed between the gate electrode G_1 and the semiconductor substrate 10 at the bottom of the trench TR_1. Moreover, the gate insulating film 20_1 is also interposed between the upper portion G2_1 of the gate electrode G_1 and the semiconductor substrate 10. Thus, the gate insulating film 20_1 electrically isolates the gate electrode G_1 from the semiconductor substrate 10. For the gate insulating film 20_1, the same material as that of the gate insulating film 20 is used.

In the trench TR_1, the STI 30 is provided in addition to the lower portion G1_1 of the gate electrode G_1. As depicted in FIG. 5B, in the trench TR_1, an STI 30_1 contacts a second side surface SF2_1 on the opposite side to the first side surface SF1_1 of the lower portion G1_1. As depicted in FIG. 5A, the STI 30_1 covers three side surfaces SF2_1 to SF4_1 other than the first side surface SF1_1 of the lower portion G1_1 of the gate electrode G_1 in trench TR_1. The STI 30_1 is thicker than the gate insulating film 20_1 and is provided to a depth substantially equal to the lower portion G1_1 of the gate electrode G_1.

Note that, in order to cover side surfaces SF1_2 to SF1_4 other than the side surface SF1_1 of the gate electrode G_1, the depth of the STI 30_1 is preferably substantially the same as or deeper than that of the gate electrode G_1. Thus, the gate electrodes G_1 and G_2 do not face the semiconductor substrate 10 other than the channel regions CH_1 and CH_2 via the gate insulating film, but face the semiconductor substrate 10 via the relatively thick STI 30. As a result, parasitic capacitances of the gate electrodes G_1 and G_2 can be suppressed to be low.

As depicted in FIG. 5B, the gate electrode G_2 is embedded in a trench TR_2 engraved from the first surface F1 of the semiconductor substrate 10. That is, a lower portion (second gate electrode portion) G1_2 of the gate electrode G_2 is embedded in the trench TR_2 engraved from the first surface F1 of the semiconductor substrate 10 toward the second surface F2 opposite to the first surface F1. An upper portion G2_2 of the gate electrode G_2 is provided on the lower portion G1_2 and is provided integrally with the lower portion G1_2. The channel region CH_2 is provided in a facing region of the semiconductor substrate 10 facing the gate electrode G_2 via a gate insulating film 20_2. The channel region CH_2 is inverted by the voltage of the gate electrode G_2, and conducts between the source region S and the drain region D. That is, the channel of the amplification transistor 34 is formed on the first side surface SF1_2 of the lower portion G1_2 of the gate electrode G_2 and the bottom surface of the upper portion G2_2. Since the current flows between the source and the drain, the current flows in the Y direction (or −Y direction). Therefore, the sum of the lengths (widths) of the channel regions CH_1 and CH_2 depicted in FIG. 5B is the channel width W34. The width (length) in the Y direction of the lower portion G1_1 or G1_2 of the gate electrode G_1 or G_2 in FIG. 5A is the channel length L34.

The lower portion G1_2 of the gate electrode G_2 narrows in the X direction and the Y direction as it becomes deeper in the Z direction from the first surface F1 toward the second surface F2. That is, the lower portion G1_2 is formed in a rectangular shape or a wedge shape tapered from the first surface F1 toward the second surface F2. Accordingly, the channel length L34 gradually decreases from the first surface F1 toward the second surface F2 as described with reference to FIG. 4C. Therefore, in the longitudinal cross section in the Z direction, the widths Wtx and Wty of the upper surface of the lower portion G1 of the lower portion G1 are wider than the widths Wbx and Wby of the bottom surface of the lower portion G1. Conversely, in the longitudinal section in the Z direction, a width Wtbd of the upper surface of the width of the body region BD is narrower than a width Wbdb of the bottom surface of the width of the body region BD. The width Wtbd is, for example, equal to or more than about 20 nm and equal to or less than about 200 nm.

The gate insulating film 20_2 is provided between the body region BD and the first side surface SF1_1 of the lower portion G1_2 of the gate electrode G_2. Furthermore, the gate insulating film 20_2 is interposed between the gate electrode G_2 and the semiconductor substrate 10 at the bottom of the trench TR_2. Moreover, the gate insulating film 20_2 is also interposed between the upper portion G2_2 of the gate electrode G_2 and the semiconductor substrate 10. Thus, the gate insulating film 20_2 electrically isolates the gate electrode G_2 from the semiconductor substrate 10. The material of the gate insulating film 20_2 may be the same as the material of the gate insulating film 20_1.

In the trench TR_2, in addition to the lower portion G1_2 of the gate electrode G_2, an STI 30_2 as a second insulating film is provided. As depicted in FIG. 5B, in the trench TR_2, the STI 30_2 contacts a second side surface SF2_2 opposite to the first side surface SF1_2 of the lower portion G1_2. As depicted in FIG. 5A, in the trench TR_2, the STI 30_2 also contacts side surfaces SF3_2 and SF4_2 facing the Y direction of the lower portion G1_2. That is, the STI 30_2 covers the three side surfaces SF2_2 to SF4_2 other than the first side surface SF1_2 of the lower portion G1_2 of the gate electrode G_2. The STI 30_2 is thicker than the gate insulating film 20_2, and is provided up to a position substantially equal to or deeper than the gate electrodes G_1 and G_2. For the STI 30_2, for example, an insulating material such as a silicon oxide film is used.

In the present disclosure, as depicted in FIG. 5A, the trench TR_2 and the gate electrode G_2 also have a substantially rectangular shape when viewed from the Z direction, and the STI 30_2 covers the three side surfaces SF2_2 to SF4_2 other than the first side surface SF1_2 of the lower portion G1_2. However, in a case where the trench TR_2 and the gate electrode G_2 have other polygonal shapes, circular shapes, semicircular shapes, and elliptical shapes, the STI 30_2 is provided on a side surface other than the side surface of the gate electrode G_2 facing the channel region CH_2. Even if the trench TR_2 and the gate electrode G_2 have a shape other than a rectangle, the gate insulating film 20_2 is provided on the side surface of the gate electrode G_2 facing the channel region CH_2. A thickness of the thickness of the STI 30_2 is thicker than that of the gate insulating film 20_2 in each of the X direction, the Y direction, and the Z direction. Thicknesses of the gate insulating film 20_2 and the STI 30_2 may be substantially equal to thicknesses of the gate insulating film 20_1 and the STI 30_1, respectively. Therefore, the distance between the side surfaces SF2_2 to SF4_2 of the gate electrode G_2 facing the semiconductor substrate 10 other than the channel region CH_2 and the semiconductor substrate 10 is larger than the distance between the first side surface SF1_2 of the gate electrode G_2 facing the channel region CH_2 and the semiconductor substrate 10.

As described above, the lower portion G1_1 of the gate electrode G_1 and the lower portion G1_2 of the gate electrode G_2 of the amplification transistor 34 according to the second embodiment face each other with the body region BD interposed therebetween, and can form channels on both sides of the body region BD. Therefore, in the amplification transistor 34 according to the second embodiment, the channel width W34 and be widened, and a relatively large current can be passed. Furthermore, in the present disclosure, the lower portion G1_2 of the gate electrode G_2 is covered with the STI 30 thicker than the gate insulating film 20 on the side surfaces SF2_2 to SF4_2 other than the first side surface SF1_2. Thus, the parasitic capacitance of the gate electrode G_2 is also small similarly to that of the gate electrode G_1. Therefore, the amplification transistor 34 of the second embodiment can also improve the conversion efficiency at the time of amplifying the pixel charge and improve the S/N ratio. Further, the operation speed of the amplification transistor 34 can be increased.

Other configurations of the second embodiment may be similar to the corresponding configurations of the first embodiment. Therefore, the second embodiment can also obtain the effect of the first embodiment.

The transistor of the second embodiment can be applied to any of the amplification transistor 34, the transfer transistor 32, the reset transistor 36, and the selection transistor 35.

Figure 6A:
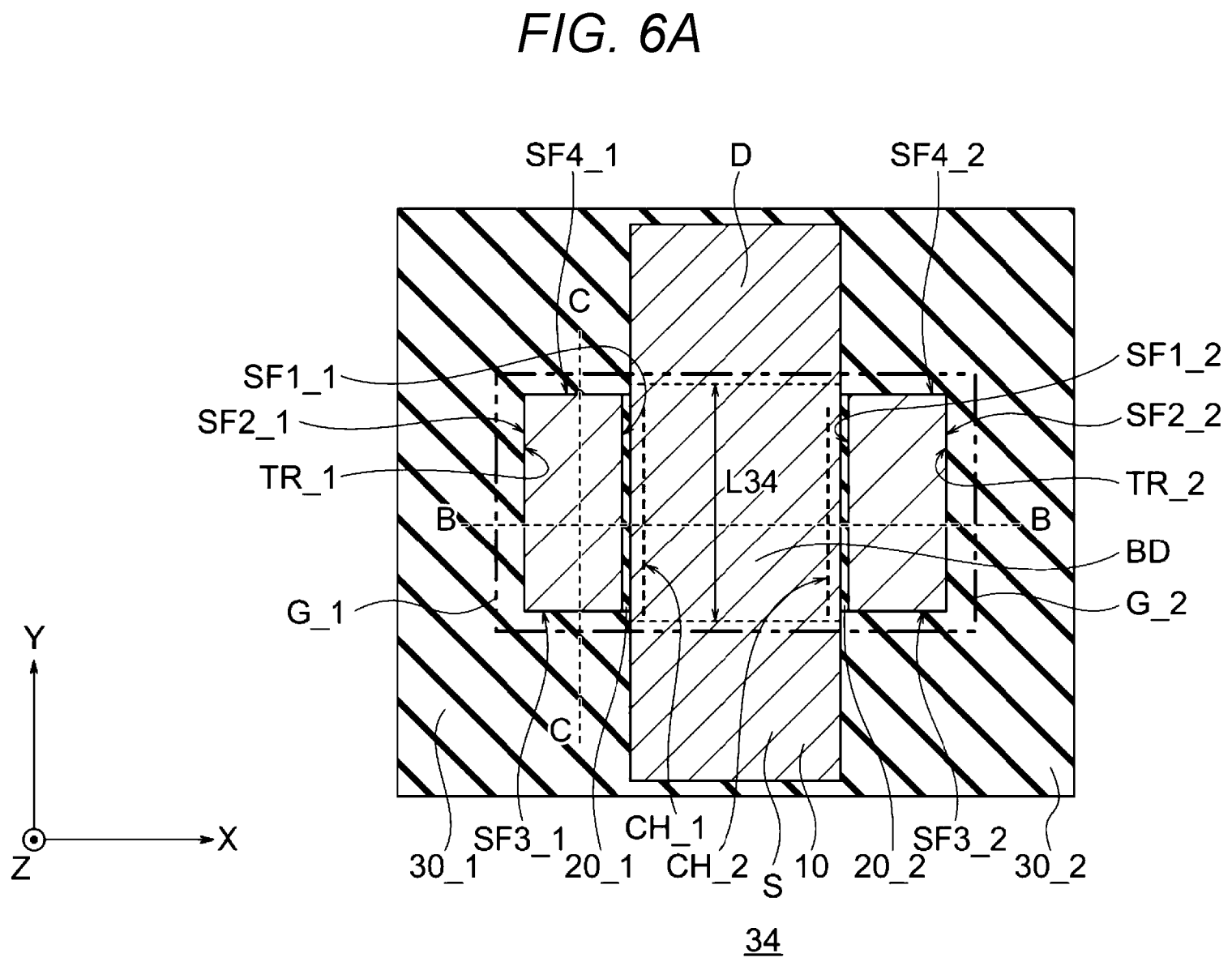
Figure 6B:
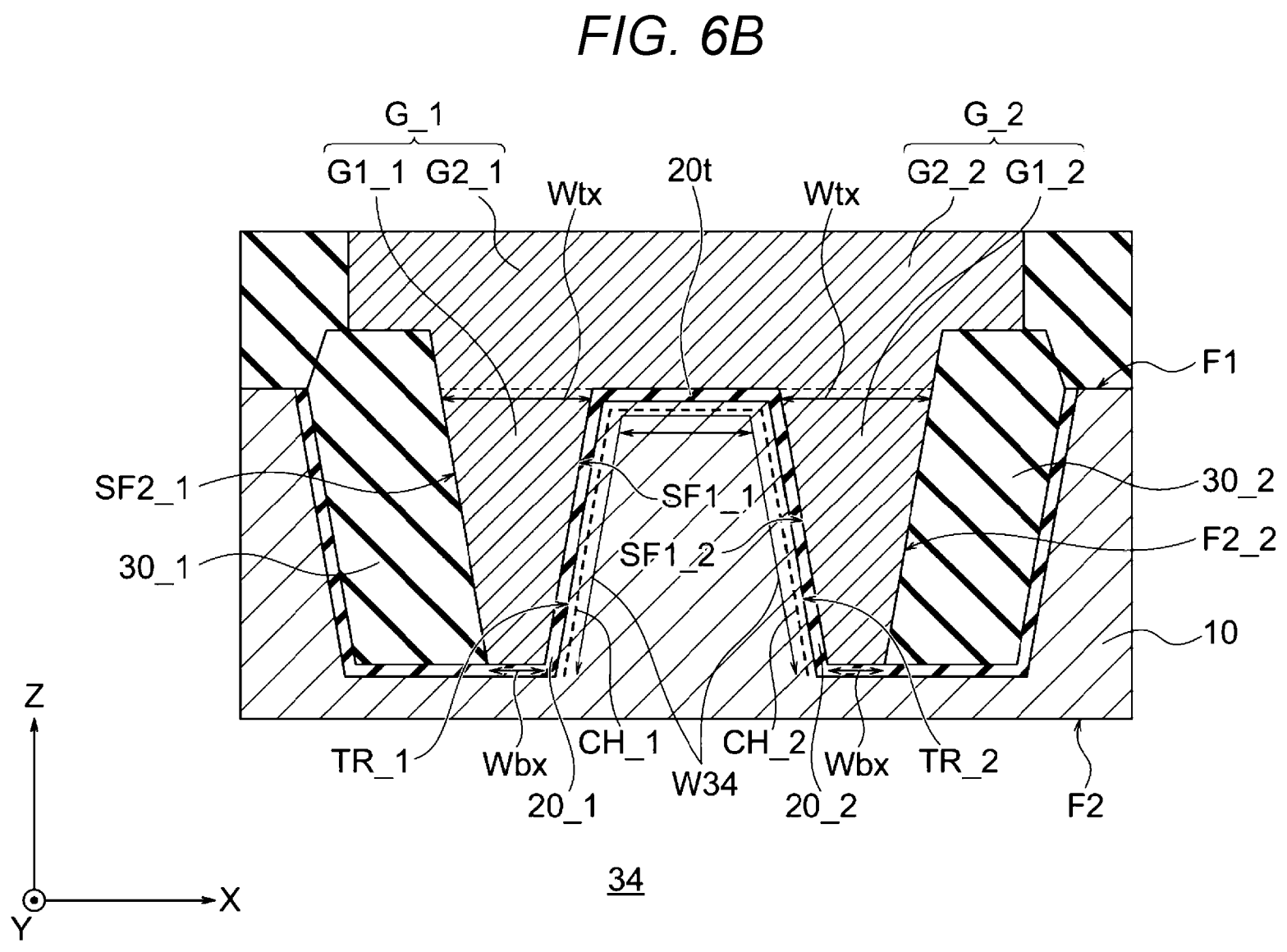

(Third Embodiment) FIG. 6A is a plan view depicting a configuration example of the amplification transistor 34 according to a third embodiment. FIG. 6A depicts a planar configuration example of the amplification transistor 34, and FIG. 6B depicts a cross-sectional view taken along line B-B of FIG. 6A. Note that the cross section taken along line C-C in FIGS. 6A and 6B may be the same as the cross section depicted in FIG. 4C.

In the third embodiment, the upper portions G2_1 and G2_2 of the gate electrodes G_1 and G_2 are integrally connected. As depicted in FIG. 6B, the upper portions G2_1 and G2_2 as the upper gate electrode portion are provided over the upper surface of the body region BD, and electrically connect the lower portion G1_1 of the gate electrode G_1 and the lower portion G1_2 of the gate electrode G_2. A gate insulating film 20*t* as an upper gate insulating film is provided between the upper surface of the body region BD and the upper portions G2_1 and G2_2. Thus, since the channel is also formed on the upper surface of the body region BD, the channel width W34 is further increased, and the current of the amplification transistor 34 can be further increased.

Other configurations of the third embodiment may be similar to the corresponding configurations of the second embodiment. Therefore, the third embodiment can also obtain the effect of the second embodiment.

Fourth Embodiment

Figure 7A:
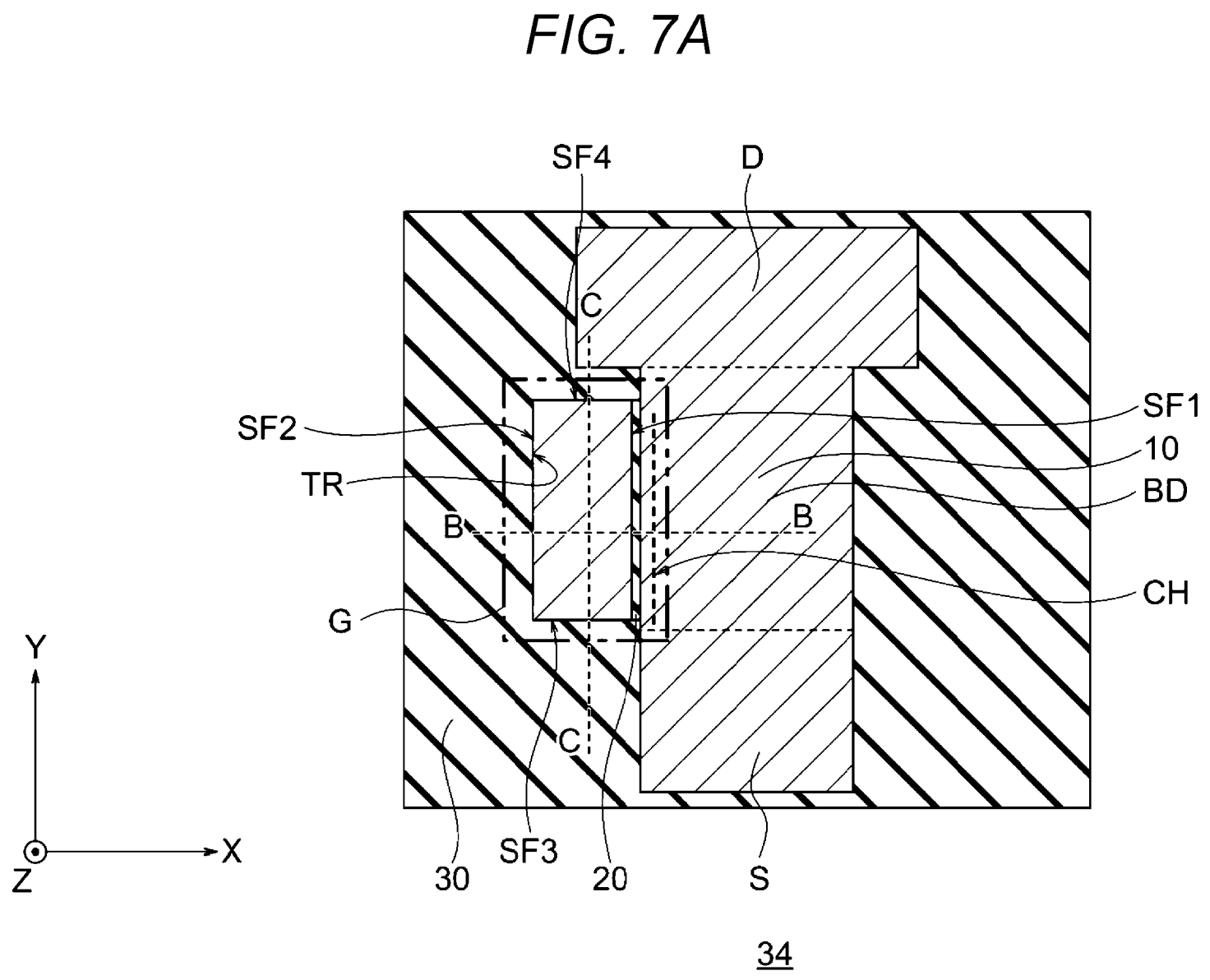
Figure 7B:
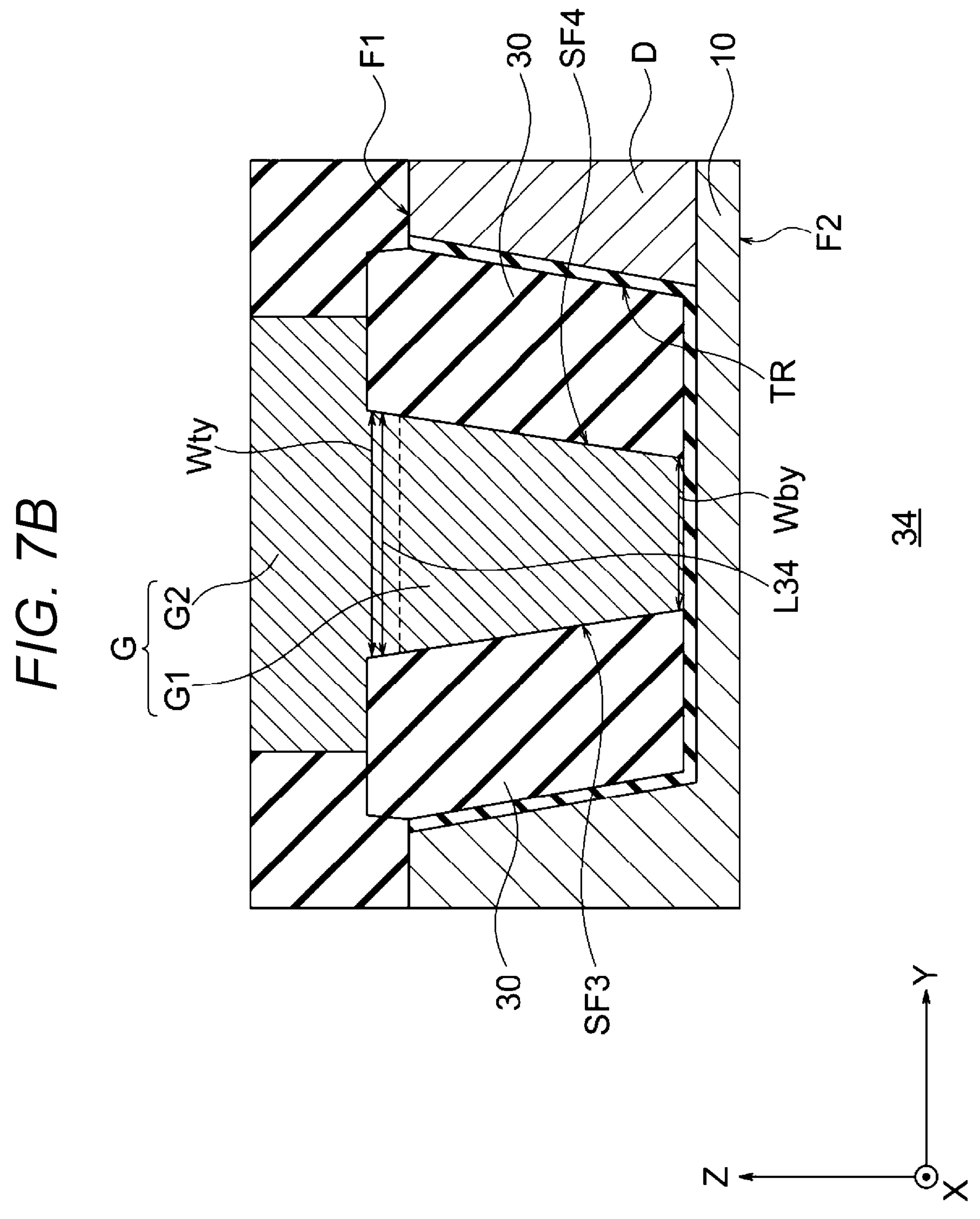
FIG. 7B is a cross-sectional view taken along line C-C in FIG. 7A.

FIG. 7A is a plan view depicting a configuration example of the amplification transistor 34 according to a fourth embodiment. FIG. 7B is a cross-sectional view taken along line C-C in FIG. 7A. In the fourth embodiment, in the X-Y plane, the width of the drain region D in the X direction (direction orthogonal to the channel length direction) is wider than that of the body region BD, and the drain region D protrudes in the ±X direction to a position facing the side surface SF4 of the lower portion G1 of the gate electrode G. Increasing the width of the drain region D facilitates contact with the drain region D.

Other configurations of the fourth embodiment may be similar to the corresponding configurations of the first embodiment. Therefore, the cross section taken along line B-B in FIG. 7A may be the same as the cross section depicted in FIG. 4B. Furthermore, the cross section of FIG. 7B is basically the same as the cross section depicted in FIG. 4C. However, in FIG. 7B, the drain region D appears on the side surface SF4 side in the Y direction of the lower portion G1 via the STI 30.

Increasing the width of the drain region D facilitates contact with the drain region D, but on the other hand, by the drain region D facing the side surface SF4 of the gate electrode G, the parasitic capacitance of the gate electrode G may increase. However, the STI 30 as the second insulating film is provided between the drain region D and the side surface SF4 of the lower portion G1 of the gate electrode G. A film thickness of the STI 30 between the drain region D and the side surface SF4 is larger than the film thickness of the gate insulating film 20. Therefore, even if the drain region D faces the side surface SF4, the parasitic capacitance of the gate electrode G does not increase so much. Therefore, the fourth embodiment can sufficiently obtain the effect of the first embodiment.

Fifth Embodiment

Figure 8A:
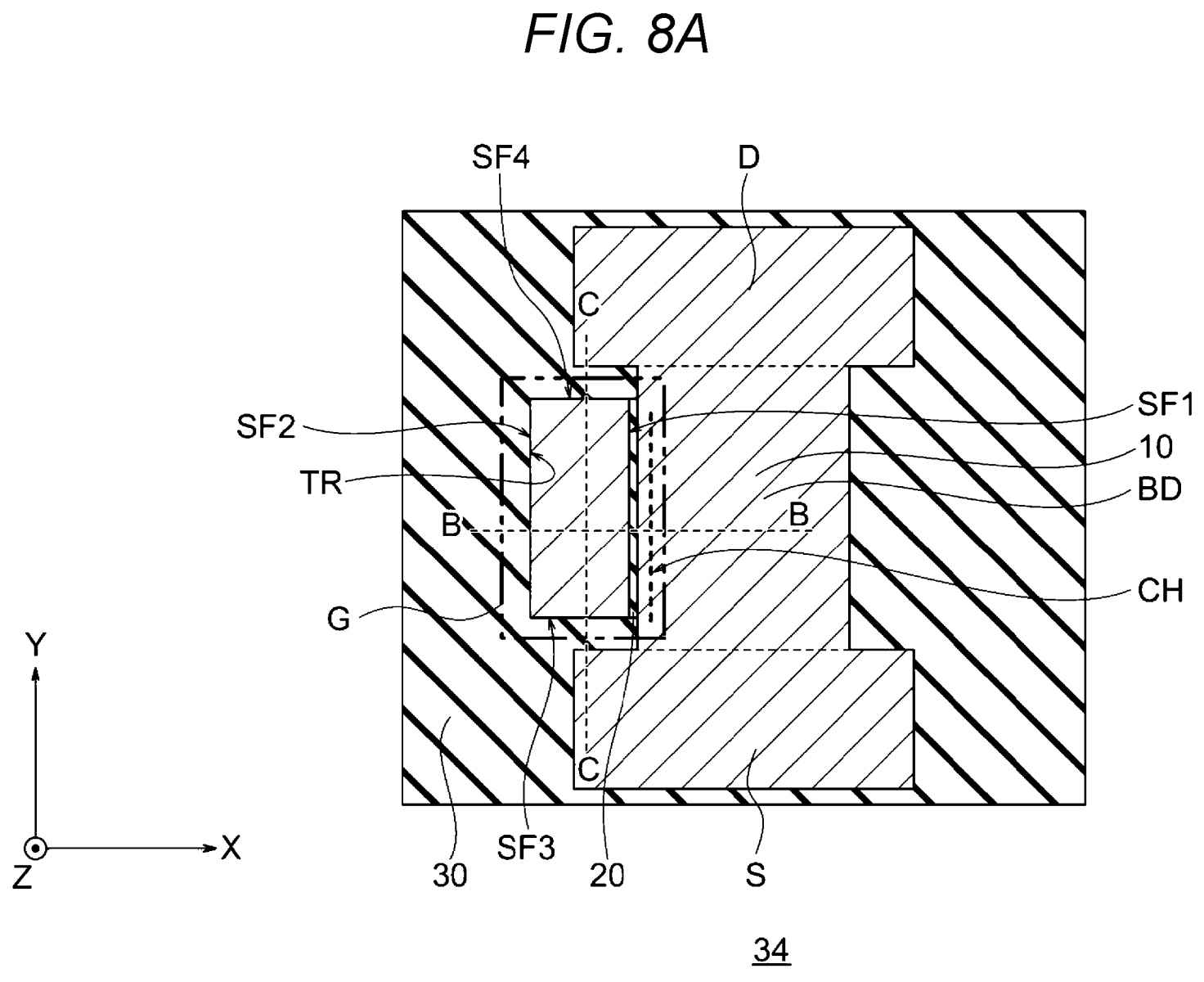
Figure 8B:
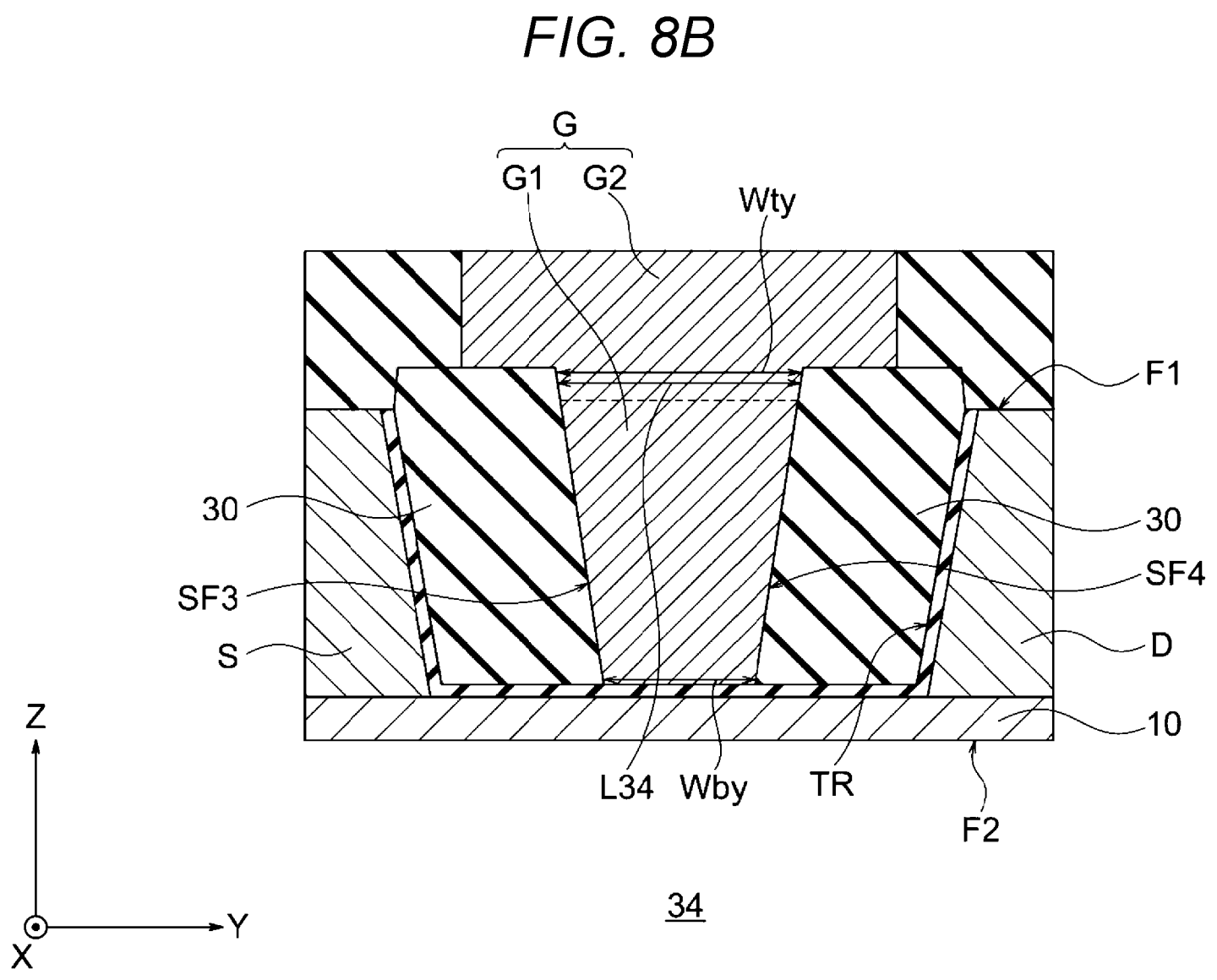

FIG. 8A is a plan view depicting a configuration example of the amplification transistor 34 according to a fifth embodiment. FIG. 8B is a cross-sectional view taken along line C-C in FIG. 8A. In the fifth embodiment, in the X-Y plane, not only the width of the drain region D but also the width of the source region S in the X direction (direction orthogonal to the channel length direction) is wider than that of the body region BD. Therefore, not only the drain region D but also the source region S protrudes in the ±X direction to a position facing the side surface SF3 of the lower portion G1 of the gate electrode G. Increasing the widths of the drain region D and the source region S facilitates contact with the drain region D and the source region S.

Other configurations of the fifth embodiment may be similar to the corresponding configurations of the first embodiment. Therefore, the cross section taken along line B-B in FIG. 8A may be the same as the cross section depicted in FIG. 4B. Furthermore, the cross section taken along line C-C in FIG. 8B is basically the same as the cross section depicted in FIG. 4C. However, in FIG. 8B, the drain region D appears on the side surface SF4 side in the Y direction of the lower portion G1 via the STI 30, and the source region S appears on the side surface SF3 side via the STI 30.

Also in the fifth embodiment, the STI 30 is provided between the source region S and the side surface SF3 of the lower portion G1 of the gate electrode G. A film thickness of the STI 30 between the source region S and the side surface SF4 is also larger than the film thickness of the gate insulating film 20. Therefore, even if the source region S faces the side surface SF3, the parasitic capacitance of the gate electrode G does not increase so much. Therefore, the present modification can also sufficiently obtain the effect of the first embodiment.

As described above, the width in the X direction of both or one of the drain region D and the source region S may be wider than that of the body region BD.

Note that the upper portion G2 of the gate electrode G is not provided above the drain region D and the source region S. That is, in plan view viewed from the Z direction, the upper portion G2 of the gate electrode G does not overlap the drain region D and the source region S. Thus, an increase in the parasitic capacitance of the gate electrode G can be suppressed.

Moreover, the drain region D, the source region S, and the body region BD of the fourth or fifth embodiment may be combined with those of the first to third embodiments.

Sixth Embodiment

Figure 9:
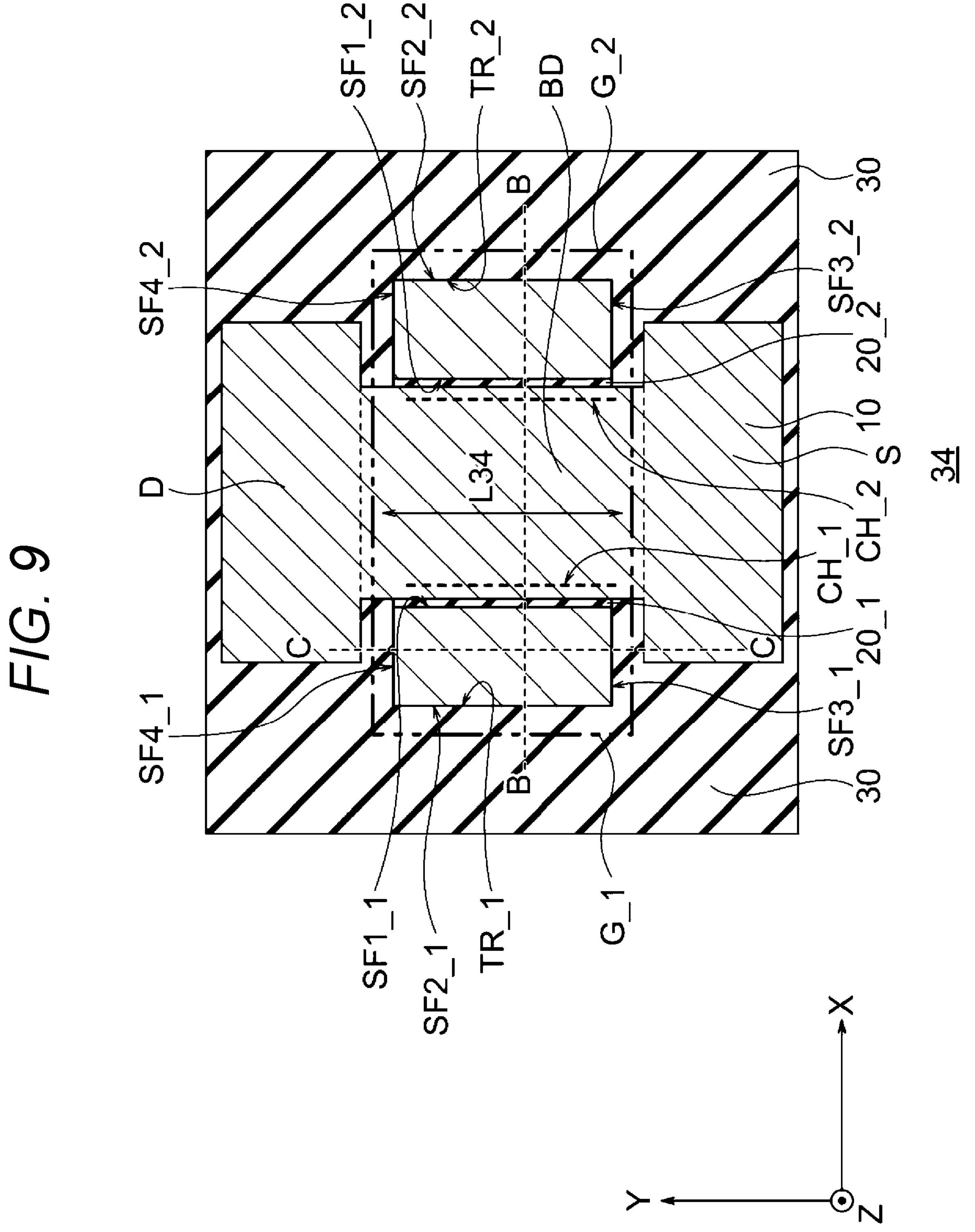
FIG. 9 is a plan view depicting a configuration example in which a drain region, a source region, and a body region of a fifth embodiment are applied to a mode of a third embodiment.

FIG. 9 is a plan view depicting an example in which the drain region D, the source region S, and the body region BD of the fifth embodiment are applied to the mode of the third embodiment. Also in the sixth embodiment, in the X-Y plane, widths of the drain region D and the source region S in the X direction (direction orthogonal to the channel length direction) are wider than that of the body region BD. Therefore, the source region S protrudes in the X direction to a position facing side surfaces SF3_1 and SF3_2 of the lower portion (G1_1 and G1_2 in FIG. 6B) of the gate electrode G. The drain region D protrudes in the X direction to a position facing the side surfaces SF4_1 and SF4_2 of the lower portion (G1_1 and G1_2 in FIG. 6B) of the gate electrode G. Increasing the widths of the drain region D and the source region S facilitates contact with the drain region D and the source region S.

Other configurations of the sixth embodiment may be similar to the corresponding configurations of the third or fifth embodiment. Therefore, the cross section taken along line B-B in FIG. 9 may be the same as the cross section depicted in FIG. 6B. Furthermore, a cross section taken along line C-C in FIG. 9 may be the same as the cross section depicted in FIG. 8B. Thus, the sixth embodiment can obtain the effects of the third and fifth embodiments.

Seventh Embodiment

Figure 10A:
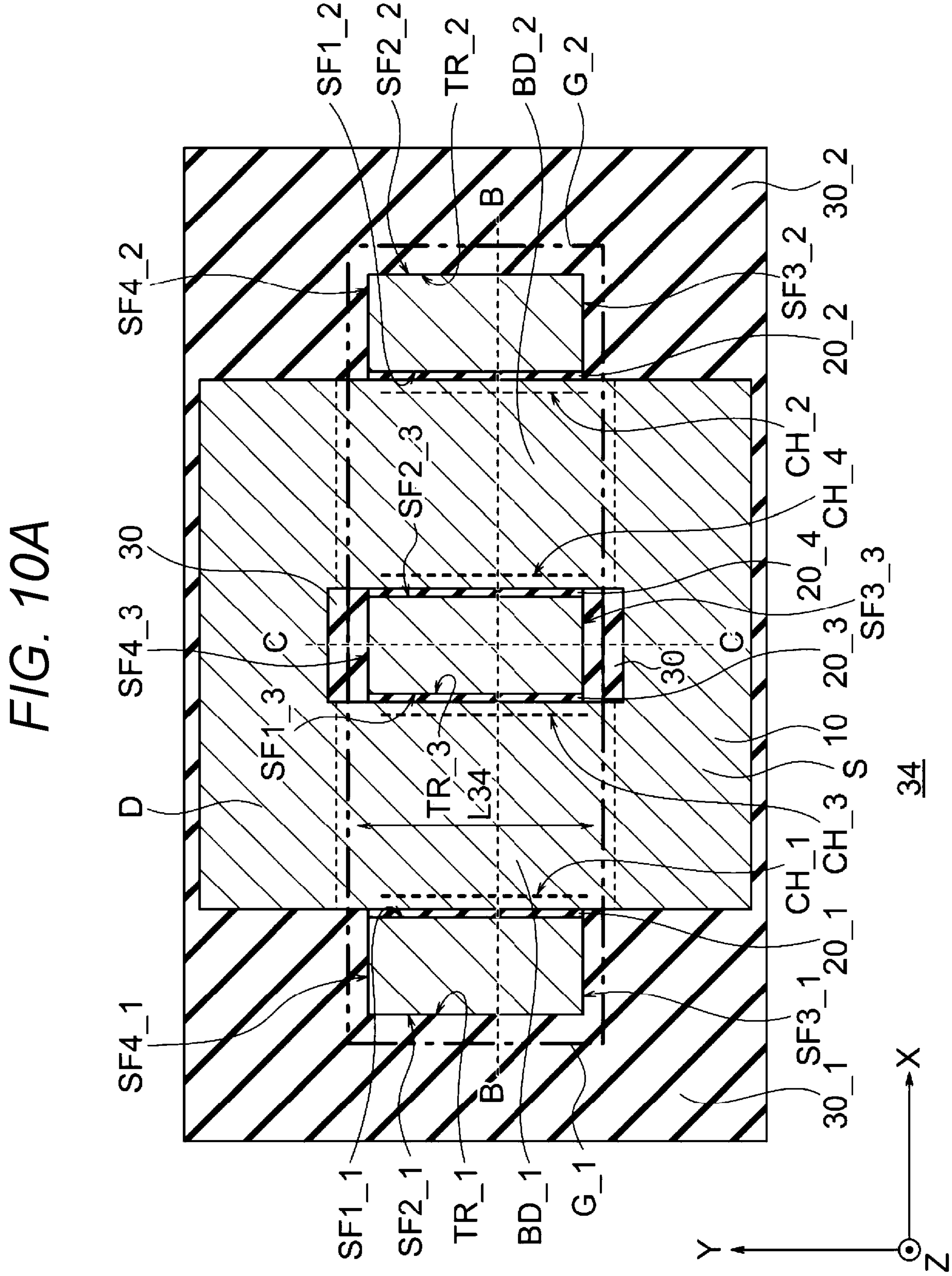
FIG. 10A is a plan view depicting a configuration example of an amplification transistor according to a seventh embodiment.
Figure 10B:
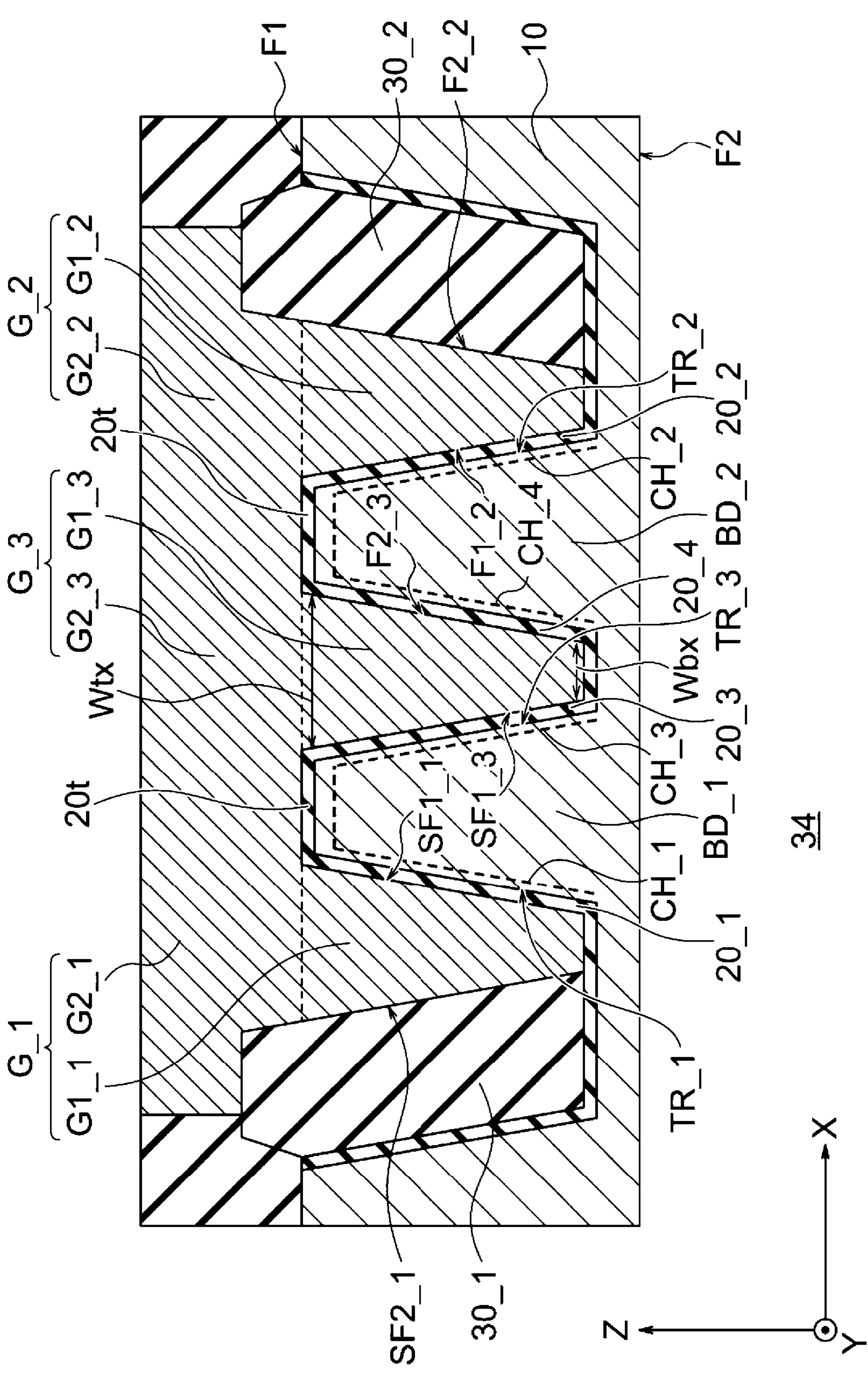
FIG. 10B is a cross-sectional view taken along line B-B in FIG. 10A.

FIG. 10A is a plan view depicting a configuration example of the amplification transistor 34 according to a seventh embodiment. FIG. 10B is a cross-sectional view taken along line B-B in FIG. 10A. A cross section taken along line C-C in FIG. 10A may be the same as that in FIG. 8B.

In the seventh embodiment, as depicted in FIG. 10B, a gate electrode G_3 as a third gate electrode is provided between the gate electrode G_1 and the gate electrode G_2. The gate electrodes G_1 and G_2 may have the same configuration as those of the third embodiment. The gate electrode G_3 is disposed midway between the gate electrode G_1 and the gate electrode G_2. The gate electrodes G_1 to G_3 are formed and arranged to be substantially symmetric with respect to the center line of the gate electrode G_3 in the Z direction (line symmetric with respect to the Z axis).

As depicted in FIG. 10B, the gate electrode G_3 is embedded in a trench TR_3 engraved from the first surface F1 of the semiconductor substrate 10. That is, a lower portion (third gate electrode portion) G1_2 of the gate electrode G_3 is embedded in the trench TR_3 engraved from the first surface F1 of the semiconductor substrate 10 toward the second surface F2 opposite to the first surface F1. An upper portion G2_3 of the gate electrode G_3 is provided on the lower portion G1_3 and is provided integrally with the lower portion G1_3. Furthermore, the upper portion G2_3 is formed integrally with the upper portion G2_1 of the gate electrode G_1 and the upper portion G2_2 of the gate electrode G_2, and connects the lower portions G1_1 to G1_3 in an electrode manner. Therefore, the gate electrodes G_1 to G_3 function as an integrated gate electrode. In a plan view in the Z direction, widths in the X direction of the upper portions G2_1 to G2_3 of the gate electrodes G_1 to G_3 are larger than the sum of widths in the X direction of the body regions BD_1 and BD_2.

A channel region CH 3 is provided in a facing region of the semiconductor substrate 10 facing the gate electrode G_3 via a gate insulating film 20_3. A channel region CH_4 is provided in a facing region of the semiconductor substrate 10 facing the gate electrode G_3 via a gate insulating film 20_4. That is, in the gate electrode G_3, the channel is formed in the body region BD facing side surfaces SF1_3 and SF2_3 of the lower portion G1_3 of the gate electrode G_3. Furthermore, the channel is also formed in the body region BD facing the bottom surfaces of the upper portions G2_1 to G2_3 via the gate insulating film. Since the current flows between the source and the drain, the current flows in the Y direction (or −Y direction). Therefore, the sum of the lengths (widths) of the channel regions CH_1 to CH_4 depicted in FIG. 10B is the channel width W34. The length L34 in FIG. 10A is the channel length.

The lower portion G1_3 of the gate electrode G_3 becomes narrower in the X direction and the Y direction as it becomes deeper in the −Z direction from the first surface F1 to the second surface F2. That is, the lower portion G1_3 is formed in a rectangular shape tapered from the first surface F1 toward the second surface F2 as are the lower portions G1_1 and G1_2. Accordingly, the channel length L34 gradually decreases from the first surface F1 toward the second surface F2 as described with reference to FIG. 4C. Therefore, as depicted in FIGS. 8B and 10B, in the longitudinal cross section in the Z direction, the widths Wtx and Wty of the upper surface of the lower portion G1_3 are wider than the widths Wbx and Wby of the bottom surface of the lower portion G1_3.

The gate insulating film 20_3 is provided between the body region BD_1 and the side surface SF1_3 of the lower portion G1_3. The gate insulating film 20_4 is provided between the body region BD_2 and the side surface SF1_4 of a lower portion G1_4. Moreover, the gate insulating film 20*t* is interposed between the upper portion G2_3 of the gate electrode G_3 and the semiconductor substrate 10. The gate insulating film is also provided at the bottom of the trench TR_3. Thus, the gate electrode G_3 is electrically separated from the semiconductor substrate 10. The material of the gate insulating films 20_3 and 20_4 may be the same as the material of the gate insulating films 20_1 and 20_2.

The lower portion G1_1 of the gate electrode G_1 and the lower portion G1_3 of the gate electrode G_3 face each other with the body region BD_1 as the first active region portion interposed therebetween. The lower portion G1_2 of the gate electrode G_2 and the lower portion G1_3 of the gate electrode G_3 face each other with the body region BD_2 as the second active region portion interposed therebetween.

As depicted in FIGS. 10A and 8B, in the trench TR_3, the STI 30 is provided between the lower portion G1_3 and the drain region D and between the lower portion G1_3 and the source region S. The STI 30 is thicker than any of the gate insulating films 20_1 to 20_4 and is provided to a depth substantially equal to those of the gate insulating films 20_3 and 20_4.

As described above, the lower portions G1_3 of the gate electrode G_3 according to the seventh embodiment face each other with the body regions BD_1 and BD_2 interposed therebetween, and can form channels on both sides of the body regions BD_1 and BD_2. Therefore, in the amplification transistor 34 according to the seventh embodiment, the channel width W34 can be further widened, and a larger current can be passed Furthermore, in the present disclosure, the lower portion G1_3 of the gate electrode G_3 is covered with the STI 30 thicker than the gate insulating film 20_1 to 20_4 on side surfaces SF4_3 and SF4_4. Thus, a parasitic capacitance between the gate electrode G_3 and the source region S and a parasitic capacitance between the gate electrode G_3 and the drain region D are reduced. Therefore, the amplification transistor 34 of the seventh embodiment can also improve the conversion efficiency at the time of amplifying the pixel charge and improve the S/N ratio. Further, the operation speed of the amplification transistor 34 can be increased.

Note that, although only one lower portion G1_3 of the gate electrode is depicted here, a plurality of lower portions 1_3 may be arranged in the X direction between the lower portion G1_1 of the gate electrode G_1 and the lower portion G1_2 of the gate electrode G_2.

Other configurations of the seventh embodiment may be similar to the corresponding configurations of the sixth embodiment. Therefore, the seventh embodiment can also obtain the effect of the sixth embodiment.

The transistor of the seventh embodiment is applicable to any of the amplification transistor 34, the transfer transistor 32, the reset transistor 36, and the selection transistor 35.

Eighth Embodiment

Figure 11:
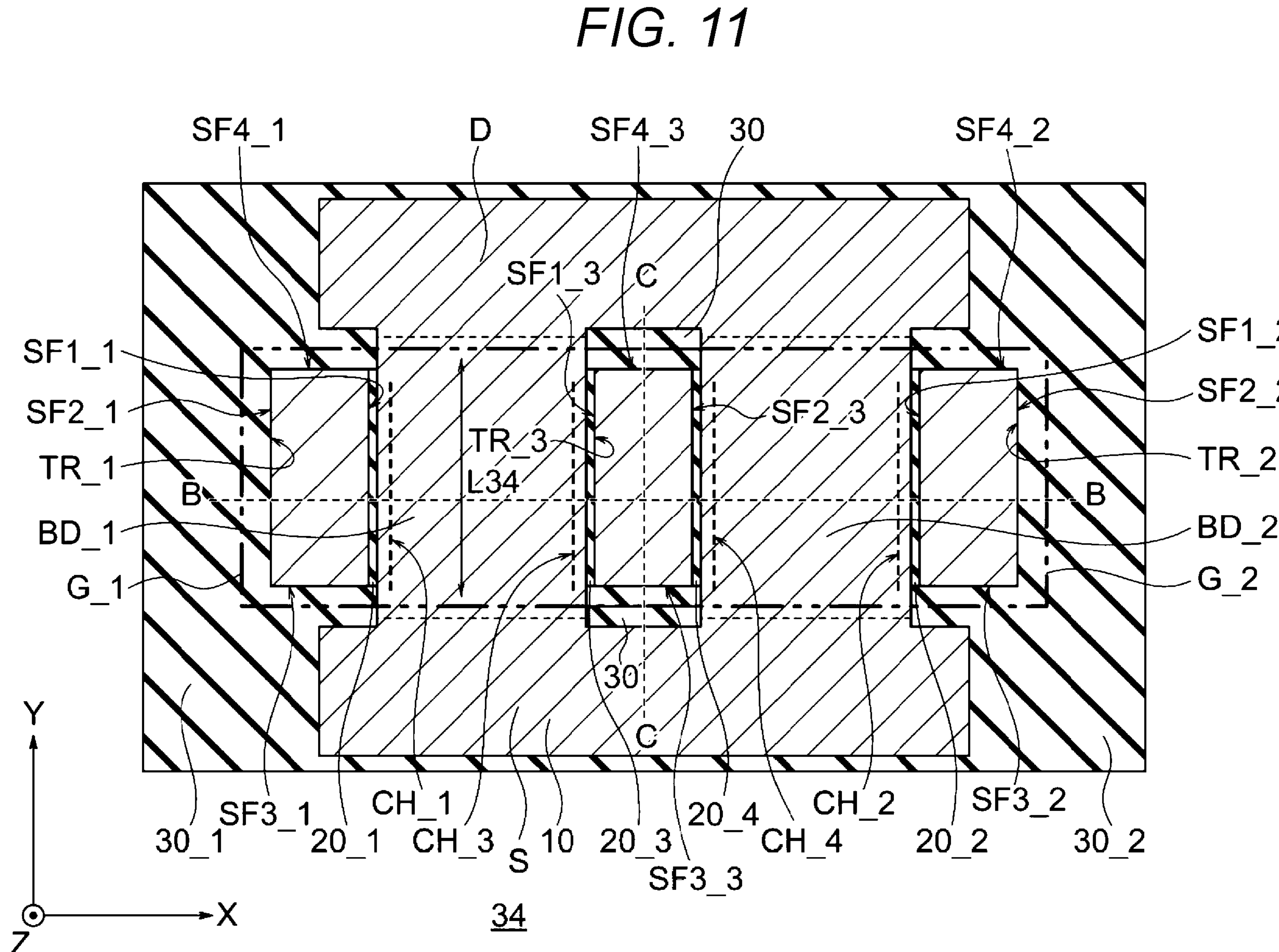
FIG. 11 is a plan view depicting a configuration example of an amplification transistor according to an eighth embodiment.

FIG. 11 is a plan view depicting a configuration example of the amplification transistor 34 according to an eighth embodiment. In the eighth embodiment, in the X-Y plane, the widths of the drain region D and the source region S in the X direction (the direction orthogonal to the channel length direction) are wider than the sum of the widths of the body regions BD_1 and BD_2 in the X direction. Therefore, the source region S protrudes in the ±X direction to a position facing the side surfaces SF3_1 and SF3_2 of the lower portions G1_1 and G1_2 of the gate electrodes G_1 and G_2. The drain region D protrudes in the X direction to positions facing the side surfaces SF4_1 and SF4_2 of the lower portions G1_1 and G1_2 of the gate electrodes G_1 and G_2. Increasing the widths of the drain region D and the source region S facilitates contact with the drain region D and the source region S.

Other configurations of the eighth embodiment may be similar to the corresponding configurations of the seventh embodiment. Therefore, the cross section taken along line B-B in FIG. 11 may be the same as that in FIG. 10B. A cross section taken along line C-C in FIG. 11 may be the same as that in FIG. 8B.

Also in the eighth embodiment, the STI 30 is provided between the source region S and a side surface SF3_3 of the gate electrode G_3 and between the drain region D and the side surface SF4_3 of the gate electrode G_3. Therefore, even when the source region S and the drain region D face the side surfaces SF3_3 and SF4_3, the parasitic capacitance of the gate electrode does not increase so much. Therefore, the eighth embodiment can also sufficiently obtain the effect of the first embodiment.

Note that, although only one lower portion G1_3 of the gate electrode is depicted here, a plurality of lower portions 1_3 may be arranged in the X direction between the lower portion G1_1 of the gate electrode G_1 and the lower portion G1_2 of the gate electrode G_2.

Ninth Embodiment

Figure 12:
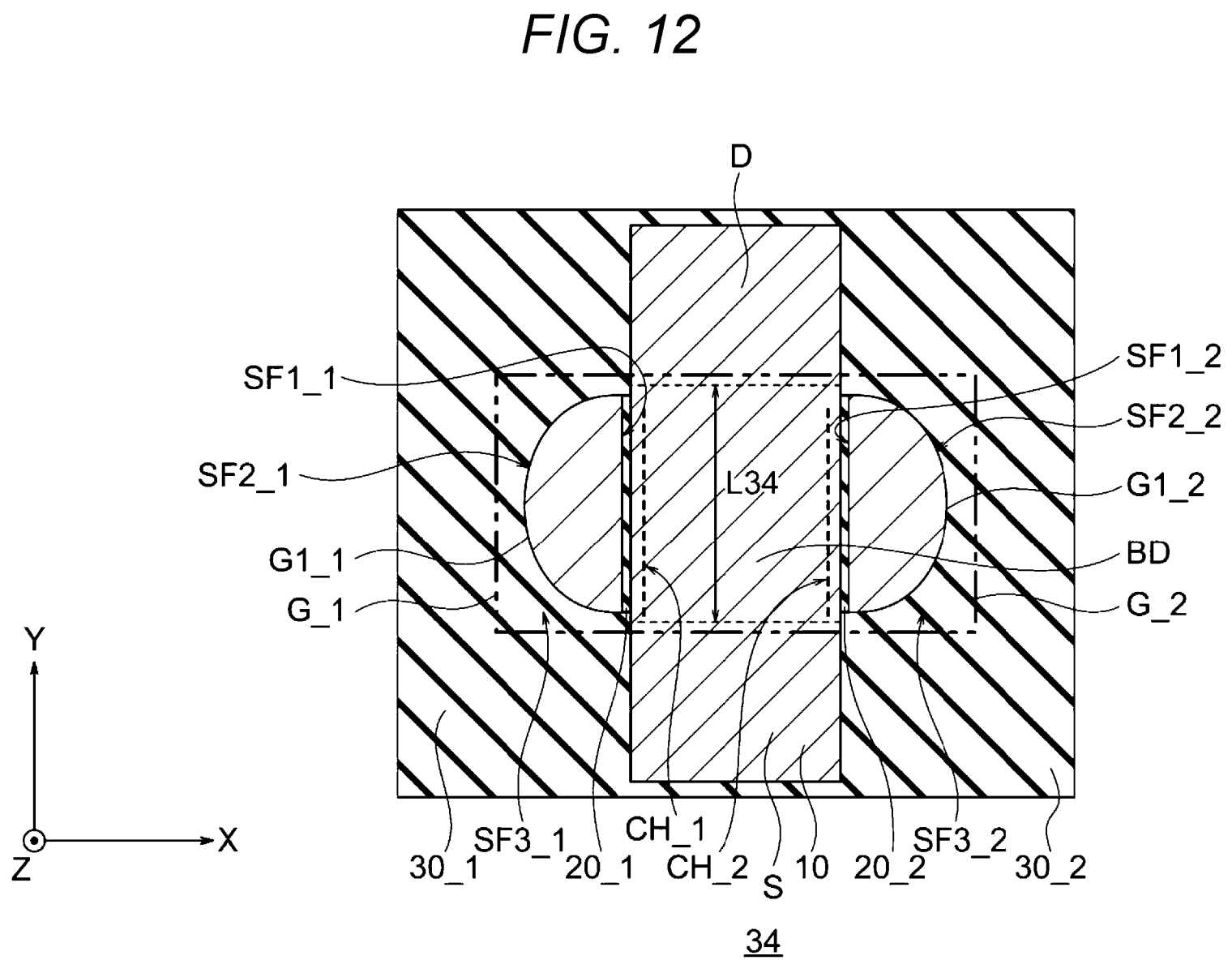

FIG. 12 is a plan view depicting a configuration example of the amplification transistor 34 according to a ninth embodiment. The ninth embodiment is different from the third embodiment in that planar shapes of the lower portion G1_1 of the gate electrode G_1 and the lower portion G1_2 of the gate electrode G_2 are semicircular in the X-Y plane. In this case, the side surface SF2_1 other than the side surface SF1_1 of the lower portion G1_1 is a curved surface, and is covered with the STI 30 thicker than the gate insulating film 20_1. The side surface SF2_2 other than the side surface SF1_2 of the lower portion G1_2 is also a curved surface, and is covered with the STI 30 thicker than the gate insulating film 20_1. Therefore, the ninth embodiment can obtain effects similar to those of the third embodiment. The ninth embodiment can also be applied to other embodiments.

Note that the ninth embodiment may be applied to any of the first to eighth embodiments.

(Manufacturing Method of Third Embodiment)

Next, as an example, a method of manufacturing the amplification transistor 34 according to the third embodiment depicted in FIG. 6B will be described.

FIGS. 13 to 16 are cross-sectional views depicting an example of the manufacturing method of the third embodiment. FIGS. 13 to 16 depict cross sections corresponding to the cross section of FIG. 6B.

First, for example, a P-type well diffusion layer is formed on the first surface F1 side of the semiconductor substrate 10, and the materials of the insulating film 151 and a hard mask HM are deposited on the first surface F1. As the hard mask HM, for example, an insulating film such as a silicon oxide film or a silicon nitride film, or a stacked film thereof is used.

Next, the material of the hard mask HM is processed into a pattern of the trenches TR_1 and TR_2 using a lithography technique and an etching technique.

Figure 13:
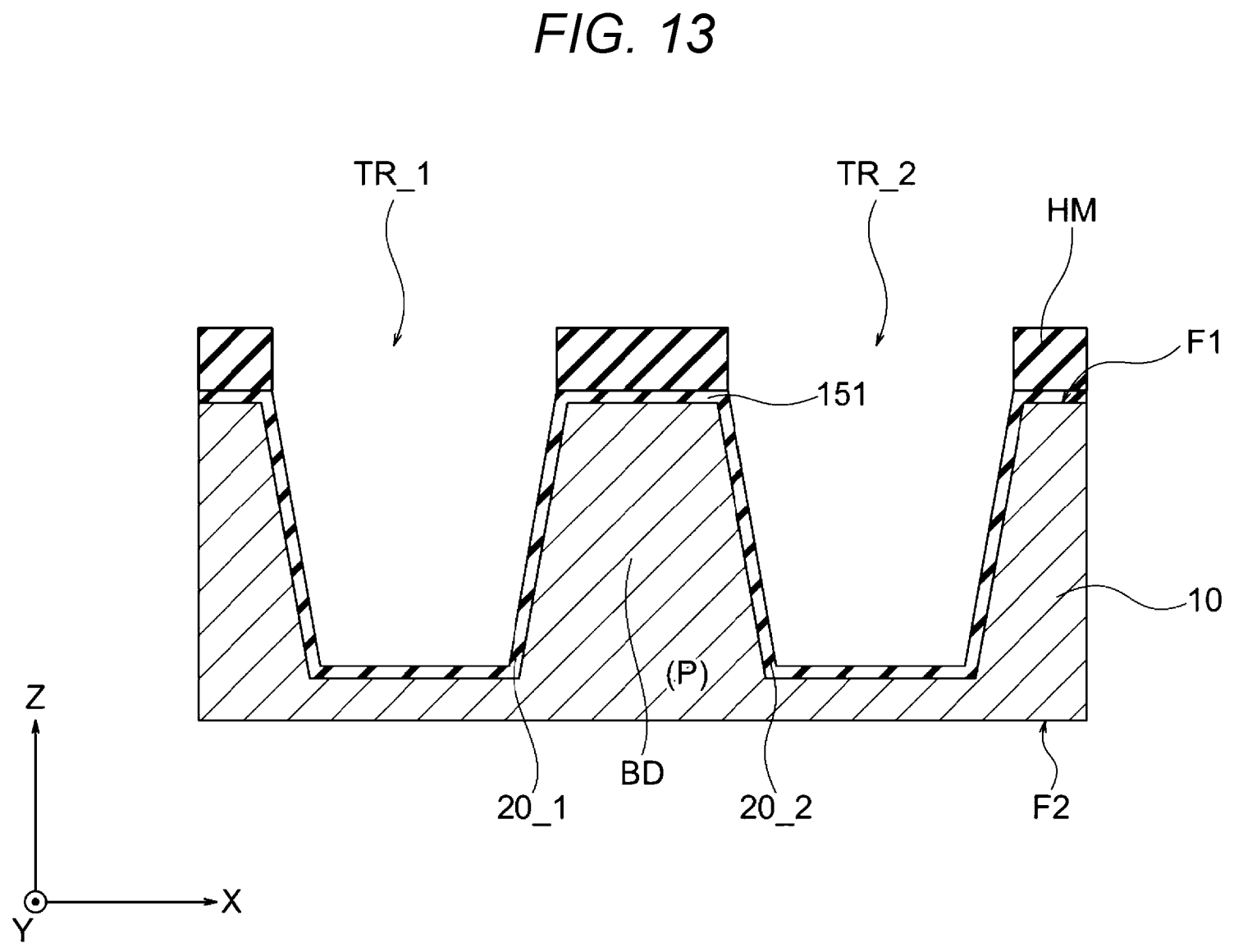

Next, the semiconductor substrate 10 is etched using the hard mask HM as a mask to form the trenches TR_1 and TR_2 as a first trench. The semiconductor substrate 10 (well) between the trenches TR_1 and TR_2 later becomes the body region BD. As depicted in FIG. 13, the body region BD is formed in a Fin shape protruding in the Z direction.

Next, the gate insulating films 20_1 and 20_2 are formed on inner walls of the trenches TR_1 and TR_2. Thus, the structure depicted in FIG. 13 is obtained.

Figure 14:
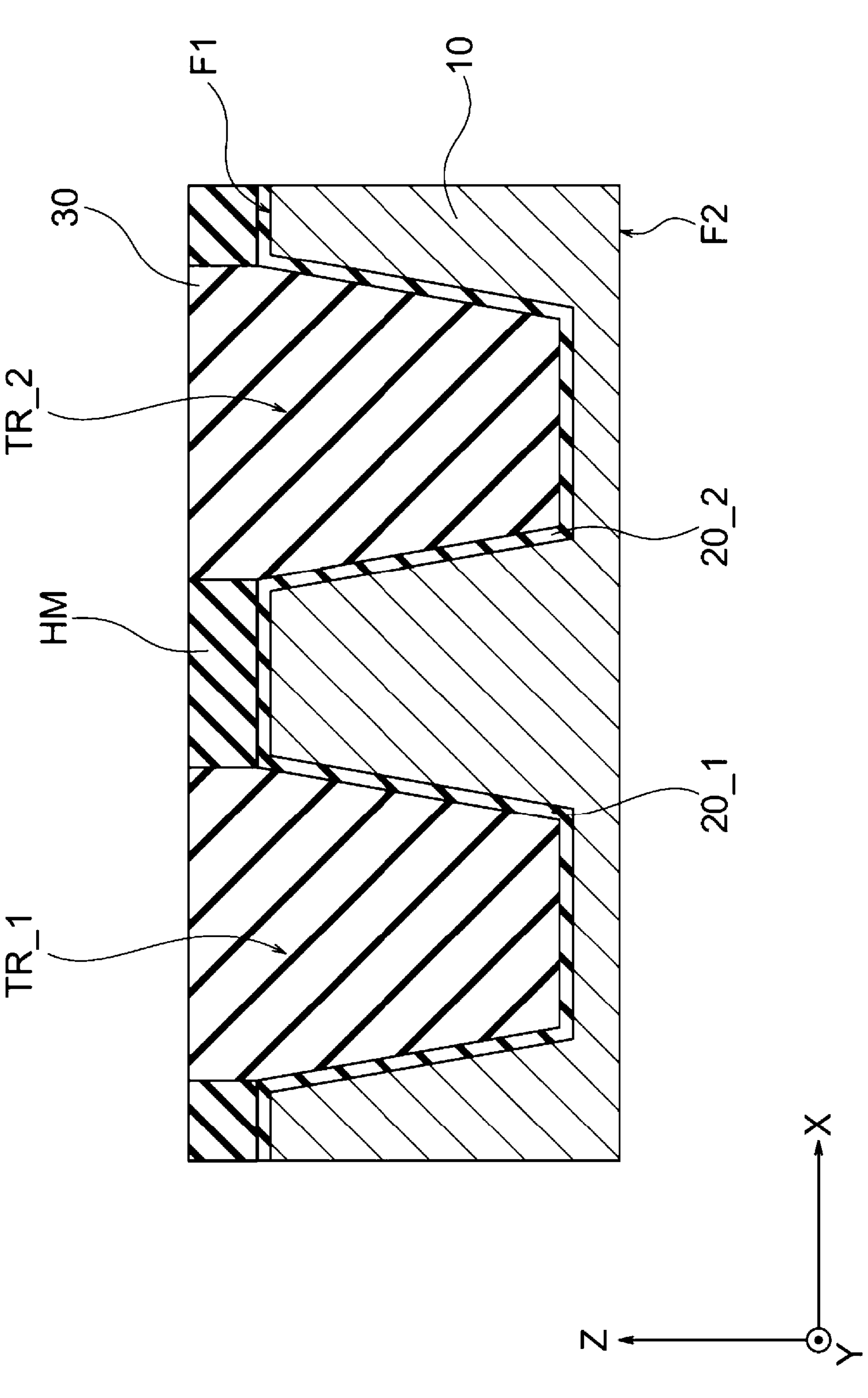
FIG. 14 is a cross-sectional view depicting an example of a manufacturing method subsequent to FIG. 13.

Next, as depicted in FIG. 14, a material (for example, a silicon oxide film) of the STI 30 is embedded in the trenches TR_1 and TR_2 by using a chemical vapor deposition (CVD) method or the like. The STI 30 is polished and planarized using a chemical mechanical polishing (CMP) method or the like until the hard mask HM is exposed.

Figure 15:
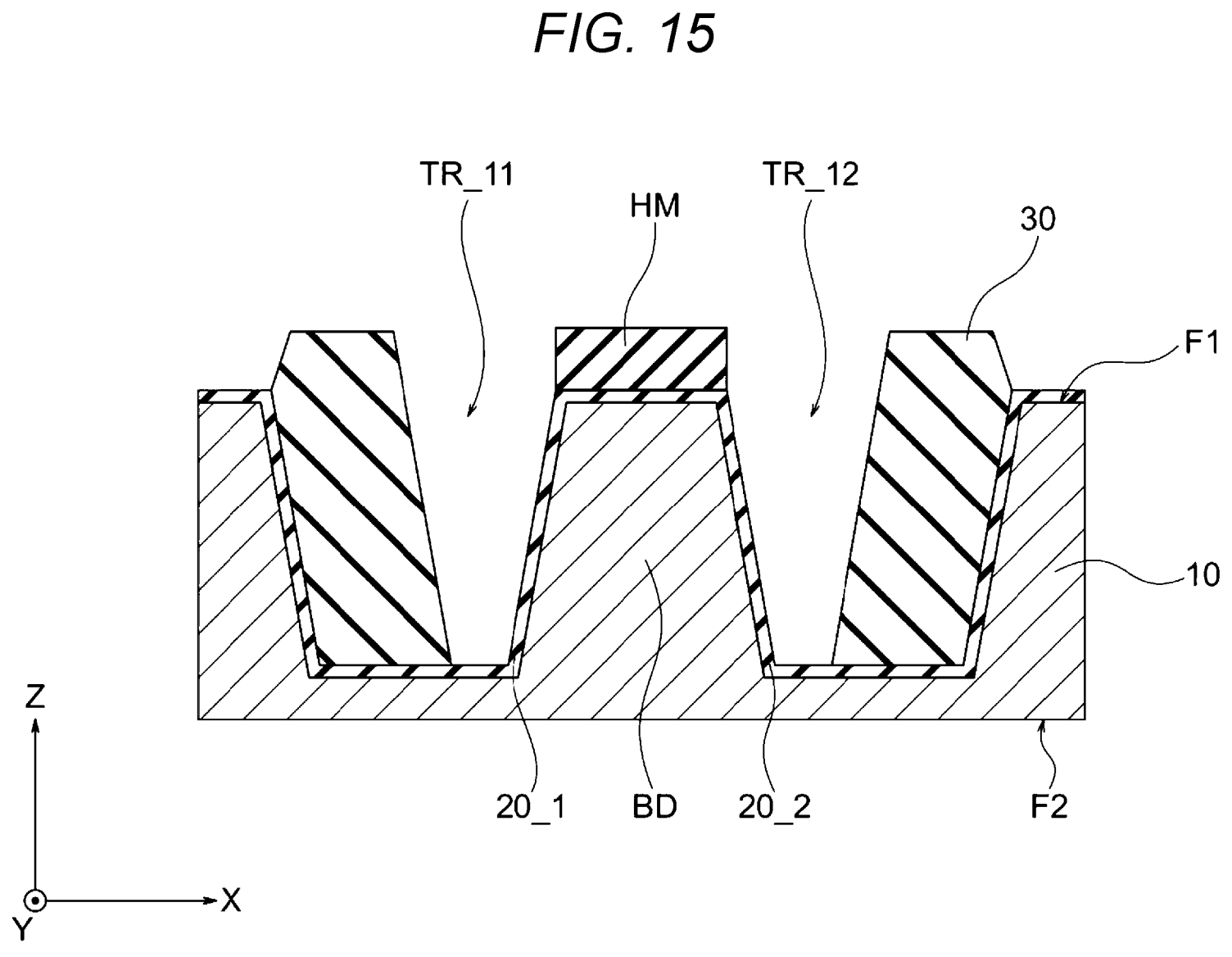

Next, the material of the STI 30 is processed into the pattern of the lower portion G1_1 of the gate electrode G_1 and the lower portion G1_2 of the gate electrode G_2 by using the lithography technique and the etching technique. Thus, as depicted in FIG. 15, the STI 30 on both sides of the body region BD in the trenches TR_1 and TR_2 are removed in a reverse tapered shape, and the second trenches TR_11 and TR_12 for embedding the lower portions G1_1 and G1_2 of the gate electrodes G_1 and G_2 are formed. At this time, the gate insulating films 20_1 and 20_2 on the side surfaces of the body region BD where the channel regions CH_1 and CH_2 are present are exposed. However, other side surfaces of the body region BD remain covered with the STI 30 thicker than the gate insulating films 20_1 and 20_2.

Figure 16:
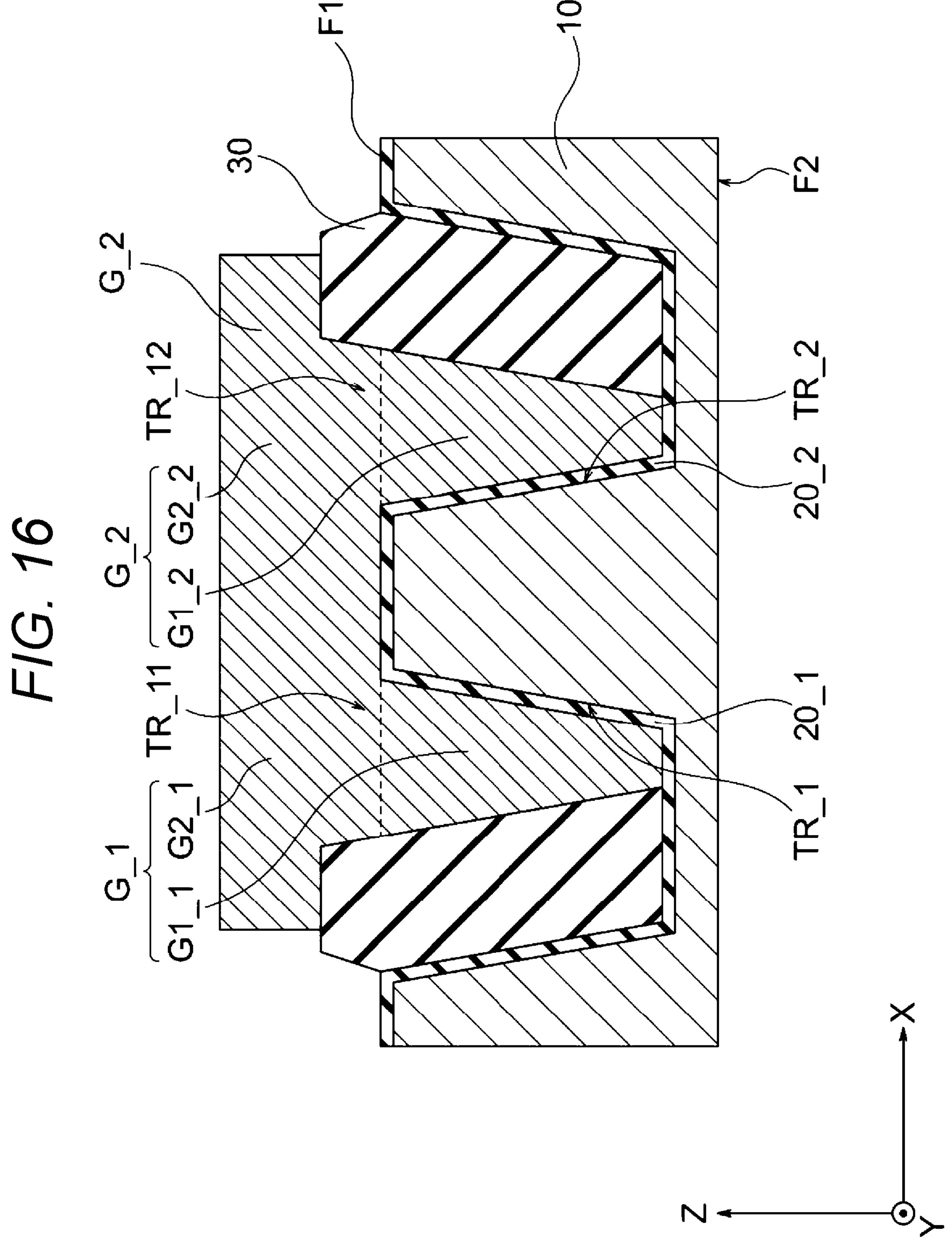
FIG. 16 is a cross-sectional view depicting an example of a manufacturing method subsequent to FIG. 13.

Next, as depicted in FIG. 16, materials (for example, a conductive material such as doped polysilicon) of the gate electrodes G_1 and G_2 are buried in the trenches TR_11 and TR_12. Moreover, the materials of the gate electrodes G_1 and G_2 are processed using the lithography technique and the etching technique. Thus, the side surfaces SF1_1 and SF1_2 of the lower portions G1_1 and G1_2 of the gate electrodes G_1 and G_2 face the body region BD via the gate insulating films 20_1 and 20_2, and face the channel regions CH_1 and CH_2. The side surfaces SF2_1 to SF4_1 and SF2_2 to SF4_2 other than the side surfaces SF1_1 and SF1_2 of the lower portions G1_1 and G1_2 are covered with the STI 30.

Moreover, by covering the gate electrodes G_1 and G_2 with an interlayer insulating film, the amplification transistor 34 depicted in FIG. 6B is completed.

The amplification transistor 34 according to another embodiment can be formed by changing a layout pattern in a process of forming a trench or the like, and thus a more detailed description of a method of manufacturing the amplification transistor is omitted here.

Figure 17:
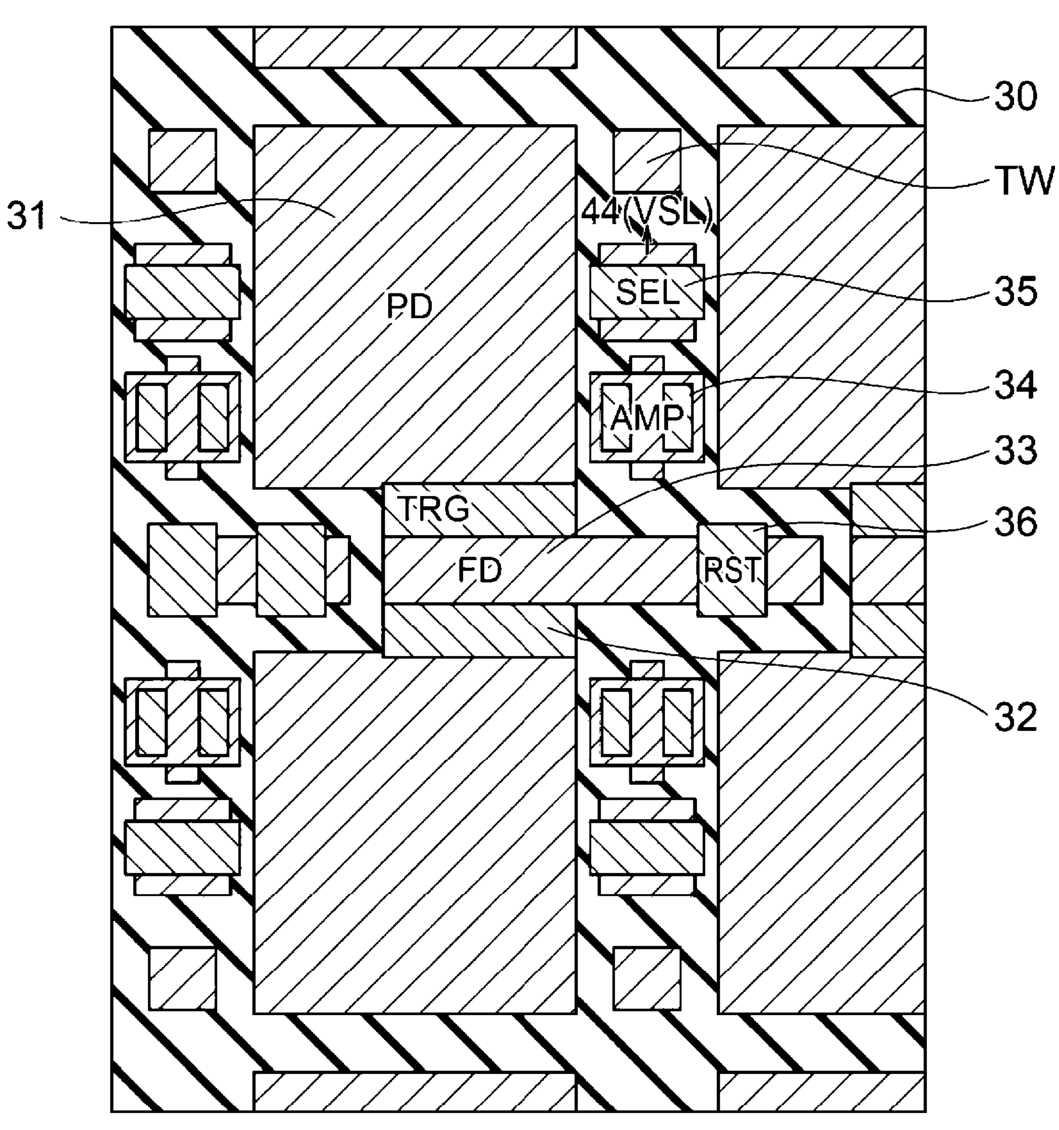
FIG. 17 is a plan view depicting an example of a layout of a pixel array section according to the present disclosure.
Figure 18:
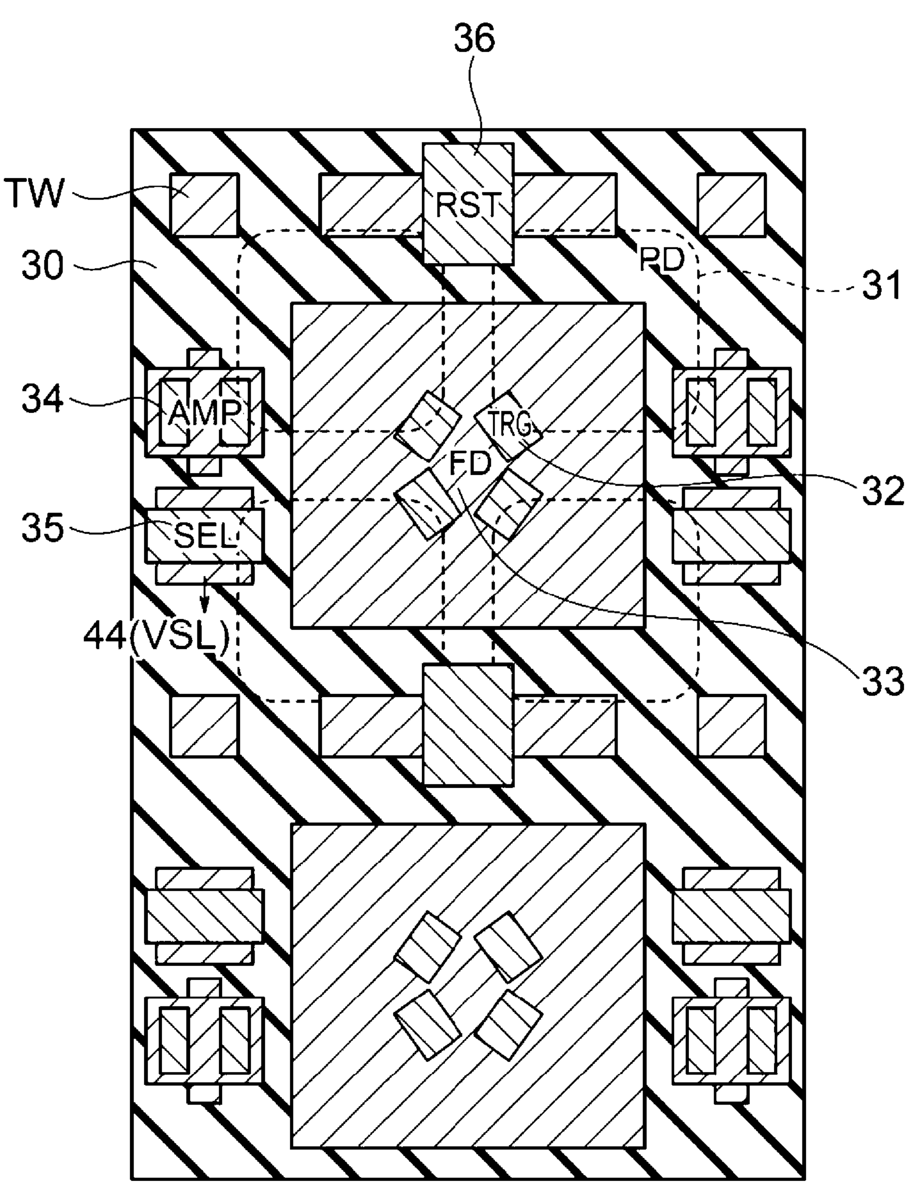
FIG. 18 is a plan view depicting an example of a layout of a pixel array section according to the present disclosure.

FIGS. 17 and 18 are plan views depicting an example of a layout of the pixel array section 12 according to the present disclosure. FIG. 17 depicts a layout of a front-illuminated CIS, and FIG. 18 depicts a layout of a back-illuminated CIS.

In the layout depicted in FIG. 17, the STI 30 is provided around each photodiode 31 to electrically and optically separate adjacent photodiodes PD. The transfer transistor 32, the FD 33, the amplification transistor 34, the selection transistor 35, and the reset transistor 36 are disposed between the photodiodes PD. One end of the selection transistor 35 is connected to the pixel output wiring 44. A well electrode TW is an electrode electrically connected to the well diffusion layer of the semiconductor substrate 10.

In the layout depicted in FIG. 18, the four photodiodes 31 share the FD 33, the amplification transistor 34, the selection transistor 35, and the reset transistor 36. The transfer transistor 32 is provided corresponding to each photodiode PD in order to transfer the charges accumulated in the four photodiodes 31 to the FD 33 at different timings.

The Fin-type transistor according to the present disclosure can be applied to both of such a front-illuminated CIS and a back-illuminated CIS.

<Application Example to Mobile Body>

The technology according to the present disclosure (the present technology) can be applied to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a boat, a robot, and the like.

FIG. 19 is a block diagram depicting a schematic configuration example of a vehicle control system which is an example of a moving body control system to which the technology according to the present disclosure can be applied.

The vehicle control system 12000 includes a plurality of electronic control units connected to each other via a communication network 12001. In the example depicted in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 19, an audio speaker 12061, a display section 12062, and an instrument panel 12063 are illustrated as the output device. The display section 12062 may, for example, include at least one of an on-board display and a head-up display.

Figure 20:
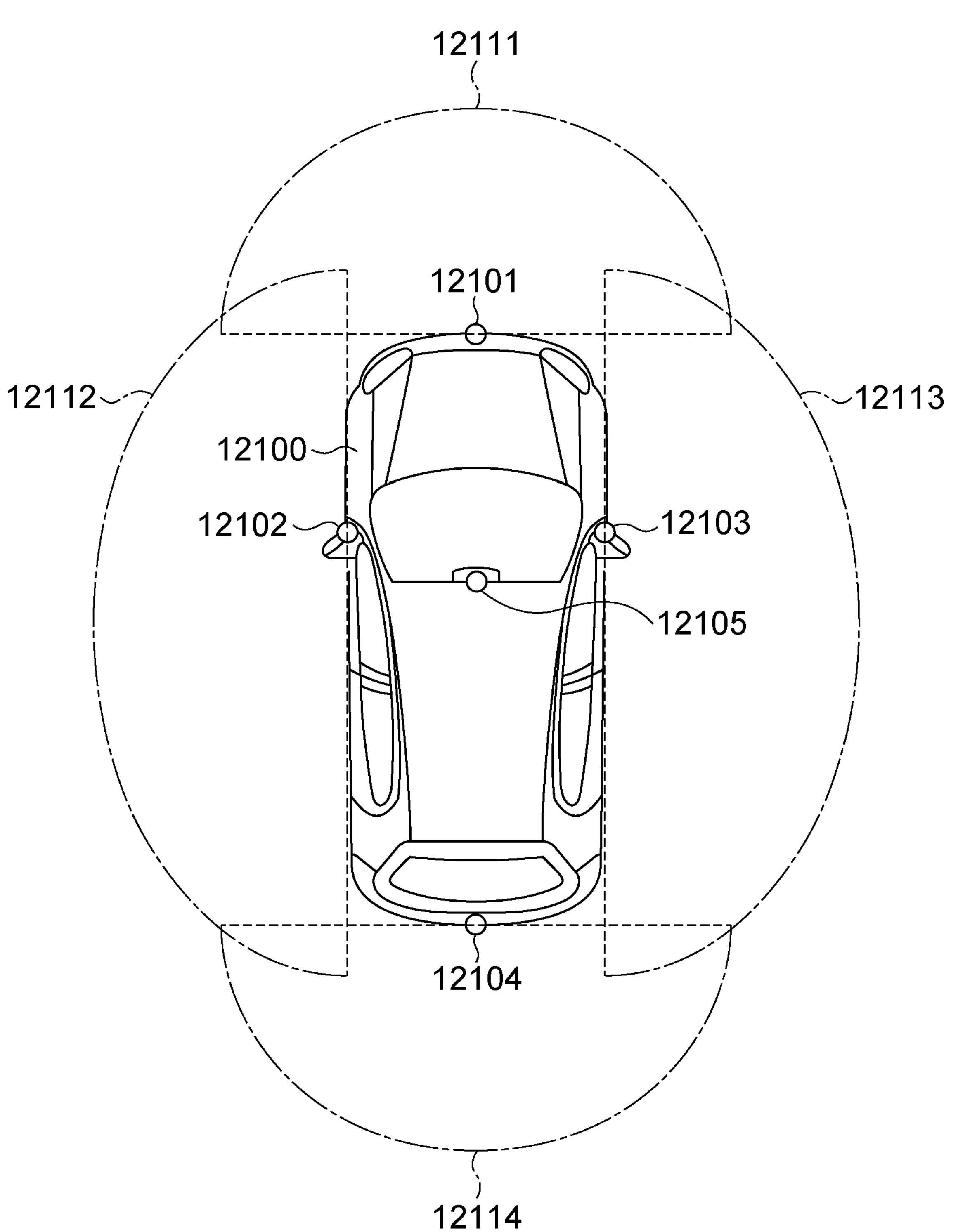
FIG. 20 is a diagram depicting an example of an installation position of an imaging section.

FIG. 20 is a diagram depicting an example of the installation position of the imaging section 12031.

In FIG. 20, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied has been described above. The solid-state imaging element according to the present disclosure can be applied to, for example, the imaging section 12031 among the above-described configurations.

Note that the present technology can also employ the following configurations.

(1)

A solid-state imaging element including a plurality of pixels that photoelectrically converts incident light, the solid-state imaging element including:

a substrate on which the plurality of pixels is provided;

a first transistor provided in each of the plurality of pixels and including a first gate electrode portion embedded in a first direction from a first surface of the substrate toward a second surface of the substrate opposite to the first surface;

a first gate insulating film provided between an active region of the substrate in which a channel of the first transistor is formed and a first side surface of the first gate electrode portion facing the active region; and a first insulating film provided on a second side surface of the first gate electrode portion other than the first side surface and thicker than the first gate insulating film, in which a depth of the first insulating film from the first surface to the second surface of the substrate is substantially same as or deeper than a depth of the first gate electrode portion, and a width of an upper surface of the first gate electrode portion is wider than a width of a bottom surface of the first gate electrode portion in a cross section in the first direction.

(2)

The solid-state imaging element according to (1), in which the first transistor further includes a second gate electrode portion embedded from the first surface toward the second surface of the substrate and electrically connected to the first gate electrode portion, and the first gate electrode portion and the second gate electrode portion face each other with the active region interposed therebetween, and the solid-state imaging element further includes a second gate insulating film provided between the active region and the second gate electrode portion.

(3)

The solid-state imaging element according to (2), in which the first transistor further includes an upper gate electrode portion provided on an upper surface of the active region between the first gate electrode portion and the second gate electrode portion and connecting between the first gate electrode portion and the second gate electrode portion, and the solid-state imaging element further includes an upper gate insulating film provided between the upper surface of the active region and the upper gate electrode portion.

(4)

The solid-state imaging element according to (3), in which assuming that a direction substantially perpendicular to a channel length direction of the first transistor in a plane substantially parallel to the first surface of the substrate is a first direction, a width of a source or a drain of the first transistor in the first direction is substantially equal to a width of the active region in the first direction.

(5)

The solid-state imaging element according to (3), in which assuming that a direction substantially perpendicular to a channel length direction of the first transistor in a plane substantially parallel to the first surface of the substrate is a first direction, a width of a source or a drain of the first transistor in the first direction is wider than a width of the active region in the first direction, and the solid-state imaging element further includes a second insulating film that is provided between a source or a drain of the first transistor and the first gate electrode portion and is thicker than the first gate insulating film.

(6)

The solid-state imaging element according to (4) or (5), in which the upper gate electrode portion is not provided above the source or the drain of the first transistor.

(7)

The solid-state imaging element according to (1), in which the first transistor further includes a second gate electrode portion embedded from the first surface toward the second surface of the substrate, and a third gate electrode portion embedded from the first surface toward the second surface of the substrate, provided between the first gate electrode portion and the second gate electrode portion, and electrically connected to the first and second gate electrode portions, the first gate electrode portion and the third gate electrode portion face each other with a first active region portion of the active region interposed therebetween, the second gate electrode portion and the third gate electrode portion face each other with a second active region portion of the active region interposed therebetween, and the solid-state imaging element further includes a second gate insulating film provided between the second active region portion and the second gate electrode portion, a third gate insulating film provided between the first active region portion and the third gate electrode portion, and a fourth gate insulating film provided between the second active region portion and the third gate electrode portion.

(8)

The solid-state imaging element according to (1), in which the first transistor further includes a second gate electrode portion embedded from the first surface toward the second surface of the substrate, and a plurality of third gate electrode portions embedded from the first surface toward the second surface of the substrate, provided between the first gate electrode portion and the second gate electrode portion, and electrically connected to the first and second gate electrode portions.

(9)

The solid-state imaging element according to (7), in which the first transistor further includes an upper gate electrode portion provided on upper surfaces of the first and second active regions and connecting the first to third gate electrode portions, and the solid-state imaging element further includes an upper gate insulating film provided between the upper surfaces of the first and second active regions and the upper gate electrode portion.

(10)

The solid-state imaging element according to (9), in which assuming that a direction substantially perpendicular to a channel length direction of the first transistor in a plane substantially parallel to the first surface of the substrate is a first direction, a width of the upper gate electrode portion in the first direction is wider than a sum of widths of the first and second active regions in the first direction.

(11)

The solid-state imaging element according to any one of (1) to (10), in which a thickness of the first gate insulating film is equal to or more than 1 nm and less than 20 nm, and a thickness of the first insulating film is equal to or more than 20 nm.

(12)

The solid-state imaging element according to any one of (1) to (11), in which in a cross section in a direction from the first surface toward the second surface of the substrate, a width of an upper surface of the active region is narrower than a width of a bottom surface of the active region.

(13)

The solid-state imaging element according to any one of (1) to (12), in which a channel length of the first transistor is equal to or more than 200 nm.

(14)

The solid-state imaging element according to (4) or (5), in which a width of the upper surface of the active region in the first direction is equal to or more than 20 nm and equal to or less than 200 nm.

(15)

The solid-state imaging element according to any one of (1) to (14), in which a depth from the first surface of the substrate to a bottom surface of the first gate electrode portion is equal to or more than 100 nm.

(16)

The solid-state imaging element according to any one of (1) to (15), in which the first transistor is applied to an amplification transistor that amplifies a signal charge accumulated in a photodiode of the pixels.

(17)

The solid-state imaging element according to any one of (1) to (16), in which the first transistor is applied to at least one of a transfer transistor that transfers a signal charge accumulated in a photodiode of the pixels, a reset transistor that eliminates a signal charge of the photodiode, or a selection transistor that selectively connects the pixels to a vertical signal line.

(18)

A method of manufacturing a solid-state imaging element including a plurality of pixels that photoelectrically converts incident light, the method including:

forming a first trench in a first surface of a substrate;

forming a gate insulating film on an inner wall of the first trench;

embedding an element isolation film in the first trench;

forming a second trench by processing the element isolation film in such a manner that the gate insulating film in a channel region of an inner wall of the first trench in which a channel is formed is exposed; and embedding a gate electrode in the second trench.

Note that the present disclosure is not limited to the above-described embodiments, and various modifications can be made without departing from the gist of the present disclosure. Furthermore, the effects described in the present description are merely examples and are not limited, and other effects may be provided.

REFERENCE SIGNS LIST

11 Solid-state imaging element
10 Semiconductor substrate
G Gate electrode S Source region
D Drain region
20 Gate insulating film
TR Trench
BD Body region
Lower portion G1
Upper portion G2
30 STI
21 Pixel
31 PD
32 Transfer transistor
33 FD
34 Amplification transistor
35 Selection transistor
36 Reset transistor

The invention claimed is:

1. A solid-state imaging element comprising:
a substrate;
a plurality of pixels on the substrate, wherein the plurality of pixels is configured to photoelectrically convert incident light;
a transistor in each of the plurality of pixels, wherein
the transistor includes a first gate electrode portion, a second gate electrode portion, and a third gate electrode portion,
the first gate electrode portion is in a first direction from a first surface of the substrate toward a second surface of the substrate,
the second surface of the substrate is opposite to the first surface of the substrate,
the second gate electrode portion is in the first direction from the first surface of the substrate to the second surface of the substrate,
the second gate electrode portion is electrically connected to the first gate electrode portion,
the third gate electrode portion is in the first direction from the first surface towards the second surface of the substrate,
the third gate electrode portion is between the first gate electrode portion and the second gate electrode portion, and
the third gate electrode portion is electrically connected to each of the first gate electrode portion and the second gate electrode portion;
a first gate insulating film between an active region of the substrate and a first side surface of the first gate electrode portion, wherein
the active region of the substrate includes a channel of the transistor, and
the first side surface of the first gate electrode portion facing the active region of the substrate,
the first gate electrode portion faces the third gate electrode portion,
a first active region portion of the active region is between the first gate electrode portion and the third gate electrode portion,
the second gate electrode portion faces the third gate electrode portion, and
a second active region portion of the active region is between the second gate electrode portion and the third gate electrode portion;
a second gate insulating film between the second active region portion and the second gate electrode portion;
a third gate insulating film between the first active region portion and the third gate electrode portion;
a fourth gate insulating film between the second active region portion and the third gate electrode portion; and
a first insulating film on a second side surface of the first gate electrode portion, wherein
the second side surface of the first gate electrode portion is different from the first side surface of the first gate electrode portion,
the first insulating film is thicker than the first gate insulating film,
a depth of the first insulating film from the first surface of the substrate to the second surface of the substrate is one of same as a depth of the first gate electrode portion or deeper than the depth of the first gate electrode portion, and
in a cross section along the first direction, a width of an upper surface of the first gate electrode portion is wider than a width of a bottom surface of the first gate electrode portion.

2. The solid-state imaging element according to claim 1, wherein
the transistor further includes an upper gate electrode portion on an upper surface of the active region,
the upper gate electrode portion is between the first gate electrode portion and the second gate electrode portion,
the upper gate electrode portion connects the first gate electrode portion and the second gate electrode portion, and
the solid-state imaging element further comprises an upper gate insulating film between the upper surface of the active region and the upper gate electrode portion.

3. The solid-state imaging element according to claim 2, wherein
a second direction is perpendicular to a channel length direction of the transistor in a plane that is parallel to the first surface of the substrate, and
one of a width of a source of the transistor in the second direction or a width of a drain of the transistor in the second direction is equal to a width of the active region in the second direction.

4. The solid-state imaging element according to claim 2, wherein
a second direction is perpendicular to a channel length direction of the transistor in a plane that is parallel to the first surface of the substrate,
one of a width of a source of the transistor in the second direction or a width of a drain of the first transistor in the second direction is wider than a width of the active region in the second direction,
the solid-state imaging element further comprises a second insulating film that is between one of the source of the transistor or the drain of the transistor and the first gate electrode portion, and
the second insulating film is thicker than the first gate insulating film.

5. The solid-state imaging element according to claim 3, wherein the upper gate electrode portion is not above the source of the transistor and the drain of the transistor.

6. The solid-state imaging element according to claim 1, wherein
the transistor further includes a plurality of third gate electrode portions in the first direction from the first surface of the substrate towards the second surface of the substrate,
the plurality of third gate electrode portions includes the third gate electrode portion,
the plurality of third gate electrode portions is between the first gate electrode portion and the second gate electrode portion, and the plurality of third gate electrode portions is electrically connected to each of the first gate electrode portion and the second gate electrode portion.

7. The solid-state imaging element according to claim 1, wherein the transistor further includes an upper gate electrode portion on each of an upper surface of the first active region portion and an upper surface of the second active region portion, the upper gate electrode portion connects the first gate electrode portion to the third gate electrode portion, the solid-state imaging element further comprises an upper gate insulating film between the upper surface of the first active region portion and the upper gate electrode portion, and the upper gate insulating film is between the upper surface of the second active region portion and the upper gate electrode portion.

8. The solid-state imaging element according to claim 7, wherein a second direction is perpendicular to a channel length direction of the transistor in a plane that is parallel to the first surface of the substrate, and a width of the upper gate electrode portion in the second direction is wider than a sum of a width of the first active region portion in the second direction and a width of the second active region portion in the second direction.

9. The solid-state imaging element according to claim 1, wherein a thickness of the first gate insulating film is equal to or more than 1 nm and less than 20 nm, and a thickness of the first insulating film is equal to or more than 20 nm.

10. The solid-state imaging element according to claim 1, wherein in the cross section along the first direction, a width of an upper surface of the active region is narrower than a width of a bottom surface of the active region.

11. The solid-state imaging element according to claim 1, wherein a channel length of the first transistor is equal to or more than 200 nm.

12. The solid-state imaging element according to claim 3, wherein a width of the upper surface of the active region in the first direction is equal to or more than 20 nm and equal to or less than 200 nm.

13. The solid-state imaging element according to claim 1, wherein a depth from the first surface of the substrate to the bottom surface of the first gate electrode portion is equal to or more than 100 nm.

14. The solid-state imaging element according to claim 1, wherein the transistor is an amplification transistor that is configured to amplify a signal charge accumulated in a photodiode of each of the plurality of pixels.

15. The solid-state imaging element according to claim 1, wherein the transistor is at least one of a transfer transistor, a reset transistor, or a selection transistor, the transfer transistor is configured to transfer a signal charge accumulated in a photodiode of the plurality of pixels, the reset transistor is configured to eliminate the signal charge of the photodiode, and the selection transistor is configured to selectively connect the plurality of pixels to a vertical signal line.

16. A method of manufacturing a solid-state imaging element, the method comprising:

forming a first trench in a first surface of a substrate;

forming a second trench in the first surface of the substrate;

forming a gate insulating film on each of an inner wall of the first trench and an inner wall of the second trench;

embedding an element isolation film in each of the first trench and the second trench;

forming a third trench by processing the element isolation film and exposing the gate insulating film in a channel region of the inner wall of the first trench;

forming a fourth trench by processing the element isolation film and exposing the gate insulating film in a channel region of the inner wall of the second trench;

embedding a first gate electrode in the third trench; and embedding a second gate electrode in the fourth trench, wherein an upper gate electrode portion of the first gate electrode is connected to an upper gate electrode portion of the second gate electrode.

* * * * *